(12) United States Patent
Chu

(10) Patent No.: US 12,527,022 B2
(45) Date of Patent: Jan. 13, 2026

(54) HETEROSTRUCTURE FIELD EFFECT TRANSISTOR (HFET) DEVICE INCLUDING CONTROLLABLE DUAL CARRIER FLOW CURRENT CHANNEL

(71) Applicant: PANJIT INTERNATIONAL INC., Kaohsiung (TW)

(72) Inventor: Hung Shen Chu, Hsinchu (TW)

(73) Assignee: PANJIT INTERNATIONAL INC., Kaohsiung (TW)

( * ) Notice: Subject to any disclaimer, the term of this patent is extended or adjusted under 35 U.S.C. 154(b) by 613 days.

(21) Appl. No.: 17/955,520

(22) Filed: Sep. 28, 2022

(65) Prior Publication Data

US 2024/0105825 A1 Mar. 28, 2024

(51) Int. Cl.
*H10D 30/47* (2025.01)
*H10D 62/815* (2025.01)
*H10D 62/85* (2025.01)

(52) U.S. Cl.
CPC ....... *H10D 30/475* (2025.01); *H10D 62/8164* (2025.01); *H10D 62/8503* (2025.01)

(58) Field of Classification Search
CPC ............... H10D 30/475; H10D 30/015; H10D 30/4732; H10D 62/8164; H10D 62/8503; H10D 62/357
See application file for complete search history.

(56) References Cited

U.S. PATENT DOCUMENTS

2016/0351564 A1* 12/2016 Azize ...................... H10D 8/60
2020/0105751 A1   4/2020 Dewey et al.

OTHER PUBLICATIONS

Josephine Chang et al., The Super-Lattice Castellated Field-Effect Transistor: A High-Power, High-Performance RF Amplifier, IEEE Electron Device Letters, Jul. 2019, pp. 1048-1051, vol. 40, No. 7.

* cited by examiner

*Primary Examiner* — William B Partridge
*Assistant Examiner* — Chevy J Boegel

(57) ABSTRACT

A semiconductor device is provided. The semiconductor device includes a substrate, a nucleation layer, a buffer layer, a superlattice stack, a cap layer, a first transistor area and a second transistor area. The first superlattice stacked layers form a two dimensional electron gas carrier transport to generate a first current channels group and the second superlattice stacked layers forming a two dimensional hole gas carrier transport at different depths to generate a second current channels group. The first transistor area has a first depth contacted to the first superlattice stacked layers. The second transistor area has a second depth contacted to the second superlattice stacked layers. The first transistor area controls the first current channels group and the second current channels group, and the second transistor area controls the second current channels group.

7 Claims, 16 Drawing Sheets

HETEROSTRUCTURE FIELD EFFECT TRANSISTOR (HFET) DEVICE INCLUDING CONTROLLABLE DUAL CARRIER FLOW CURRENT CHANNEL

BACKGROUND OF THE INVENTION

1. Field of the Invention

The present invention generally relates to a semiconductor device, and in particular, to the heterostructure field effect transistor device having the controllable dual carrier flow current channel.

2. Description of the Related Art

Recently, the high power semiconductor device has the growing demand and the III-V gallium nitride power device is the frequently used material for forming semiconductor device operated in high speed, high power and high temperature. The gallium nitride (GaN) material may have an energy band gap of about 3.4 eV. The semiconductor device contains the gallium nitride material can be used in the power converters, power suppliers. These are widely used in the vehicles, the electrical motors, or other power device.

Many power devices require conversion of different electrical power. However, the technology used to provide the different power modes usually take up a lot of design space. The corresponding structure is unable to reduce the size of the semiconductor device. In addition, the switching of devices is not easy to control. The conventional semiconductor device is not able to provide suitable device with high power, high speed and high controllability.

In summary, the conventional semiconductor device still has considerable problems. Hence, the present disclosure provides the structure of the semiconductor device to resolve the shortcomings of conventional technology and promote industrial practicability.

SUMMARY OF THE INVENTION

In view of the aforementioned technical problems, the primary objective of the present disclosure is to provide a semiconductor device, which is capable of forming a controllable dual carrier flow power heterostructure field effect transistor device.

In accordance with one objective of the present disclosure, a semiconductor device is provided. The semiconductor device includes a substrate, a nucleation layer, a buffer layer, a superlattice stack, a cap layer, a first transistor area and a second transistor area. The nucleation layer is disposed on the substrate. The buffer layer is disposed on the nucleation layer. The superlattice stack is disposed on the buffer layer. The superlattice stack sequentially includes a set of first superlattice stacked layers and a set of second superlattice stacked layers. The set of first superlattice stacked layers form a two dimensional electron gas (2DEG) carrier transport to generate a first current channels group and the set of second superlattice stacked layers form a two dimensional hole gas (2DHG) carrier transport at different depths to generate a second current channels group. The cap layer is disposed on the superlattice stack. The first transistor area is electrically connected to the superlattice stack. The first transistor area includes a first source contact, a first drain contact and a first gate contact disposed between the first source contact and the first drain contact. The first transistor area has a first depth contacted to the set of first superlattice stacked layers. The second transistor area is electrically connected to the superlattice stack. The second transistor area includes a second source contact, a second drain contact and a second gate contact disposed between the second source contact and the second drain contact. The second transistor area has a second depth contacted to the set of second superlattice stacked layers. Wherein the first transistor area controls the first current channels group and the second current channels group, and the second transistor area controls the second current channels group.

Preferably, the set of first superlattice stacked layers may include a plurality of first layer groups, and each of the plurality of first layer groups sequentially includes GaN superlattice layer and AlGaN superlattice layer. The set of second superlattice stacked layers may include a plurality of second layer groups, and each of the plurality of second layer groups sequentially includes GaN superlattice layer and InGaN superlattice layer.

Preferably, thickness of one AlGaN superlattice layer and one GaN superlattice layer in the set of first superlattice stacked layers may be from 20 nm to 80 nm, and thickness of one InGaN superlattice layer and one GaN superlattice layer in the set of second superlattice stacked layers may be from 20 nm to 80 nm.

Preferably, the set of first superlattice stacked layers may include an ith AlGaN superlattice layer composed of $Al_{(xi)}Ga_{(1-xi)}N$ and the set of second superlattice stacked layers may include an kth InGaN superlattice layer composed of $In_{(zk)}Ga_{(1-zk)}N$, xi and zk are designed ratio values range from 0.3 to 1.

Preferably, the set of first superlattice stacked layers may include a plurality of first layer groups, each of the plurality of first layer groups sequentially includes GaN superlattice layer, AlN spacer layer and AlGaN superlattice layer. The set of second superlattice stacked layers may include a plurality of second layer groups, each of the plurality of second layer groups sequentially includes GaN superlattice layer and InGaN superlattice layer.

Preferably, thickness of one AlGaN superlattice layer and one GaN superlattice layer in the set of first superlattice stacked layers may be from 20 nm to 80 nm, thickness of one InGaN superlattice layer and one GaN superlattice layer in the set of second superlattice stacked layers may be from 20 nm to 80 nm, and thickness of the AlN spacer layer may be from 0.5 nm to 1 nm.

Preferably, the set of first superlattice stacked layers may include an ith AlGaN superlattice layer composed of $Al_{(xi)}Ga_{(1-xi)}N$ and the set of second superlattice stacked layers may include an kth InGaN superlattice layer composed of $In_{(zk)}Ga_{(1-zk)}N$, xi and zk are designed ratio values range from 0.3 to 1.

Preferably, the semiconductor device may further include an isolate wall disposed between the first transistor area and the second transistor area.

Preferably, the semiconductor device may have a device thickness, the device thickness is less than 150 μm.

In accordance with one objective of the present disclosure, a semiconductor device is provided. The semiconductor device includes a substrate, a nucleation layer, a buffer layer, a superlattice stack, a cap layer, a first transistor area, a second transistor area and a third transistor area. The nucleation layer is disposed on the substrate. The buffer layer disposed on the nucleation layer. The superlattice stack is disposed on the buffer layer. The superlattice stack sequentially includes a first set of first superlattice stacked layers, a second set of first superlattice stacked layers and a set of second superlattice stacked layers. The first set of first superlattice stacked layers and the second set of first superlattice stacked layers form a two dimensional electron gas (2DEG) carrier transport to generate a first current channels group and the set of second superlattice stacked layers form a two dimensional hole gas (2DHG) carrier transport at different depths to generate a second current channels group. The cap layer is disposed on the superlattice stack. The first transistor area is electrically connected to the superlattice stack. The first transistor area includes a first source contact, a first drain contact and a first gate contact disposed between the first source contact and the first drain contact. The first transistor area has a first depth contacted to the first set of first superlattice stacked layers. The second transistor area is electrically connected to the superlattice stack. The second transistor area includes a second source contact, a second drain contact and a second gate contact disposed between the second source contact and the second drain contact. The second transistor area has a second depth contacted to the second set of first superlattice stacked layers. The third transistor area is electrically connected to the superlattice stack. The third transistor area includes a third source contact, a third drain contact and a third gate contact disposed between the third source contact and the third drain contact. The third transistor area has a third depth contacted to the set of second superlattice stacked layers. The first transistor area and the second transistor area controls the first current channels group and the second current channels group, and the third transistor area controls the second current channels group.

Preferably, the first set of first superlattice stacked layers may include a plurality of first set layer groups and the second set of first superlattice stacked layers may include a plurality of second set layer groups, each of the plurality of first set layer groups and the second set layer groups sequentially includes GaN superlattice layer and AlGaN superlattice layer. The set of second superlattice stacked layers may include a plurality of second layer groups, each of the plurality of second layer groups sequentially includes GaN superlattice layer and InGaN superlattice layer.

Preferably, thickness of one AlGaN superlattice layer and one GaN superlattice layer in the first set of first superlattice stacked layers may be from 20 nm to 80 nm, thickness of one AlGaN superlattice layer and one GaN superlattice layer in the second set of first superlattice stacked layers may be from 20 nm to 80 nm, and thickness of one InGaN superlattice layer and one GaN superlattice layer in the set of second superlattice stacked layers may be from 20 nm to 80 nm.

Preferably, the first set of first superlattice stacked layers may include an ith AlGaN superlattice layer composed of $Al_{(xi)}Ga_{(1-xi)}N$, the second set of first superlattice stacked layers may include an jth AlGaN superlattice layer composed of $Al_{(yj)}Ga_{(1-yj)}N$ and the set of second superlattice stacked layers may include an kth InGaN superlattice layer composed of $In_{(zk)}Ga_{(1-zk)}N$, xi, yj and zk are designed ratio values range from 0.3 to 1.

Preferably, the first set of first superlattice stacked layers may include a plurality of first set layer groups, each of the plurality of first set layer groups sequentially includes GaN superlattice layer, AlN spacer layer and AlGaN superlattice layer, the second set of first superlattice stacked layers may include a plurality of second set layer groups, each of the plurality of second set layer groups sequentially includes GaN superlattice layer, AlN spacer layer and AlGaN superlattice layer, the set of second superlattice stacked layers include a plurality of second layer groups, each of the plurality of second layer groups sequentially comprises GaN superlattice layer and InGaN superlattice layer.

Preferably, thickness of one AlGaN superlattice layer and one GaN superlattice layer in the first set of first superlattice stacked layers may be from 20 nm to 80 nm, thickness of one AlGaN superlattice layer and one GaN superlattice layer in the second set of first superlattice stacked layers may be from 20 nm to 80 nm, thickness of one InGaN superlattice layer and one GaN superlattice layer in the set of second superlattice stacked layers may be from 20 nm to 80 nm. Thickness of the AlN spacer layer may be from 0.5 nm to 1 nm.

Preferably, the first set of first superlattice stacked layers may include an ith AlGaN superlattice layer composed of $Al_{(xi)}Ga_{(1-xi)}N$, the second set of first superlattice stacked layers may include an jth AlGaN superlattice layer composed of $Al_{(yj)}Ga_{(1-yj)}N$ and the set of second superlattice stacked layers may include an kth InGaN superlattice layer composed of $In_{(zk)}Ga_{(1-zk)}N$, xi, yj and zk are designed ratio values range from 0.3 to 1.

Preferably, the semiconductor device may further include isolate walls disposed between the first transistor area and the second transistor area, and between the second transistor area and the third transistor area.

Preferably, the semiconductor device may have a device thickness, the device thickness is less than 150 μm.

As mentioned previously, the semiconductor device in accordance with the present disclosure may have one or more advantages as follows.

1. The semiconductor device are capable of providing a dual carrier flow heterostructure field effect transistor with controllable current channels and the power modes of the semiconductor device can be controlled by the multiple gate contact electrodes to obtain the high performance and high power device.
2. The semiconductor device may use the III-V compounds to form the stacked layers and to provide the wide bandgap range of the semiconductor with piezoelectric and spontaneous polarization, and to increase the thermal reliability by the two dimensional electron gas carrier transport and the two dimensional hole gas carrier transport.
3. The semiconductor device may using the spacer layer to increase the carrier mobility for obtaining the high speed semiconductor device, and the transistor areas can form the integrated chip to decrease the smaller or thinner device.

BRIEF DESCRIPTION OF THE DRAWINGS

The technical features, detail structures, advantages and effects of the present disclosure will be described in more details hereinafter with reference to the accompanying drawings that show various embodiments of the invention as follows.

DETAILED DESCRIPTION OF THE PREFERRED EMBODIMENTS

Figure 1A:
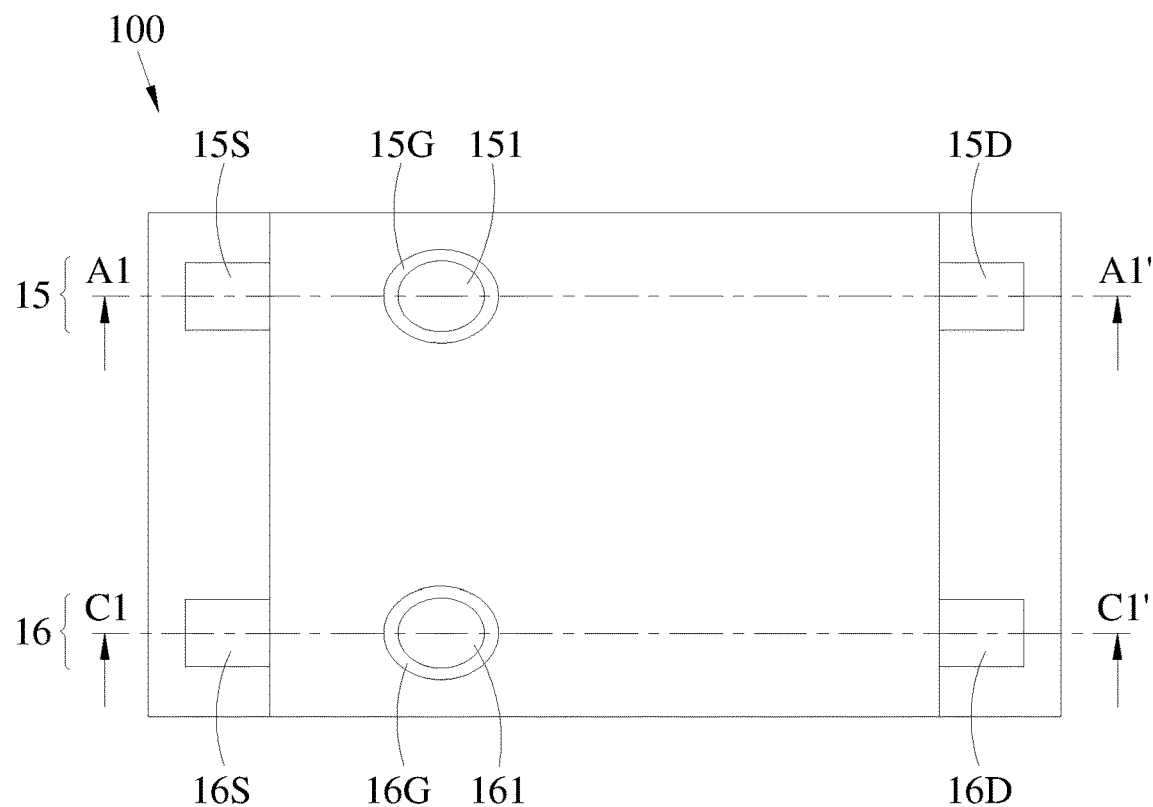
FIG. 1A, FIG. 1B and FIG. 1C are schematic diagrams of the semiconductor device in accordance with the first embodiment of the present disclosure.

In order to facilitate the understanding of the technical features, the contents and the advantages of the present disclosure, and the effectiveness thereof that can be achieved, the present disclosure will be illustrated in detail below through embodiments with reference to the accompanying drawings. The diagrams used herein are merely intended to be schematic and auxiliary to the specification, but are not necessary to be true scale and precise to the configuration after implementing the present disclosure. Thus, it should not be interpreted in accordance with the scale and the configuration of the accompanying drawings to limit the scope of the present disclosure on the practical implementation.

As those skilled in the art would realize, the described embodiments may be modified in various different ways. The exemplary embodiments of the present disclosure are for explanation and understanding only. The drawings and description are to be regarded as illustrative in nature and not restrictive. Similar reference numerals designate similar elements throughout the specification.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

Figure 1B:
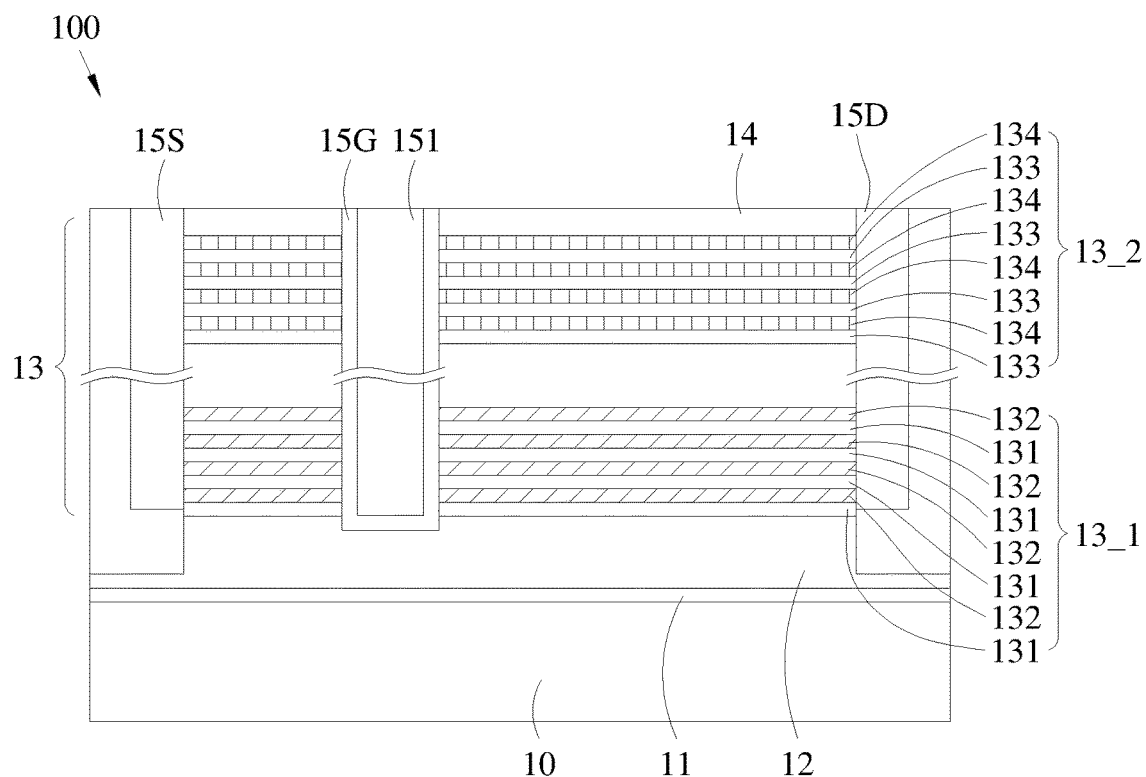
Figure 1C:
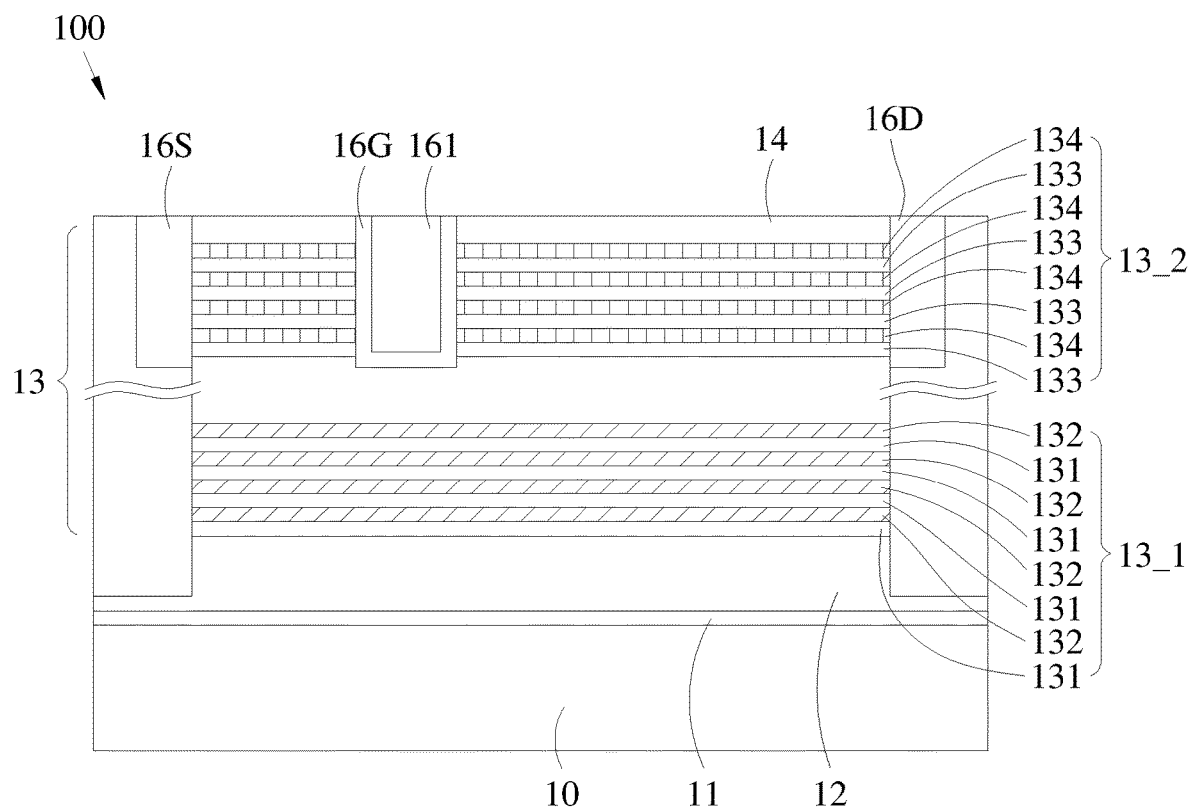

Please refer to FIG. 1A, FIG. 1B and FIG. 1C, which are schematic diagrams of the semiconductor device in accordance with the first embodiment of the present disclosure. FIG. 1A shows the plan view of a semiconductor device 100. FIG. 1B shows the section view of a semiconductor device 100 along the dash line A1A1' of the FIG. 1A. FIG. 1C shows the section view of a semiconductor device 100 along the dash line C1C1' of the FIG. 1A.

As shown in FIG. 1A, FIG. 1B and FIG. 1C, the semiconductor device 100 includes a substrate 10, a nucleation layer 11, a buffer layer 12, a superlattice stack 13, a cap layer 14, a first transistor area 15 and a second transistor area 16. The substrate 10 is a native Silicon carbide (SiC) substrate. The nucleation layer 11 including GaN material is disposed on the substrate 10. The buffer layer 12 including GaN material is disposed on the nucleation layer 11. After forming the buffer layer 12, the superlattice stack 13 is formed on the buffer layer 12. The cap layer 14 including GaN material is disposed on the superlattice stack 13.

The superlattice stack 13 is formed by a plurality of heterojunction superlattice layers. In the present disclosure, the superlattice stack 13 sequentially includes a set of first superlattice stacked layers 13_1 and a set of second superlattice stacked layers 13_2. The set of first superlattice stacked layers 13_1 are disposed on the buffer layer 12 and the set of second superlattice stacked layers 13_2 are disposed on the set of first superlattice stacked layers 13_1. The set of first superlattice stacked layers 13_1 form a two dimensional electron gas (2DEG) carrier transport to generate a first current channels group and the set of second superlattice stacked layers 13_2 form a two dimensional hole gas (2DHG) carrier transport at different depths to generate a second current channels group. The different carrier flow transport means form the multi-channel semiconductor layers.

The set of first superlattice stacked layers 13_1 include a plurality of first layer groups, and each of the plurality of first layer groups sequentially includes GaN superlattice layer 131 and AlGaN superlattice layer 132. The AlGaN superlattice layer 132 is used as the barrier layer and GaN superlattice layer 131 is used as the channel layer. One GaN superlattice layer 131 and one AlGaN superlattice layer 132 in the set of first superlattice stacked layers 13_1 may have a thickness from 20 nm to 80 nm. In other embodiment, the thickness of one pair of the GaN superlattice layer 131 and the AlGaN superlattice layer 132 may be from 20 nm to 40 nm. The heterojunction superlattice layers of the GaN superlattice layer 131 and AlGaN superlattice layer 132 form the two dimensional electron gas carrier transport to generate the first current channels group. The first current channels group is generated in the GaN superlattice layer 131 and is disposed at bottom position adjacent to the buffer layer 12.

The set of second superlattice stacked layers 13_2 include a plurality of second layer groups, and each of the plurality of second layer groups sequentially includes GaN superlattice layer 133 and InGaN superlattice layer 134. One GaN superlattice layer 133 and one InGaN superlattice layer 134 in the set of second superlattice stacked layers 13_2 may have a thickness from 20 nm to 80 nm. In other embodiment, the thickness of one pair of the GaN superlattice layer 133 and the InGaN superlattice layer 134 may be about 20 nm to 40 nm. The heterojunction superlattice layers of GaN superlattice layer 133 and InGaN superlattice layer 134 form the two dimensional hole gas carrier transport to generate the second current channels group. The second current channels group is generated in the GaN superlattice layer 133 and is disposed at top position adjacent to the cap layer 14.

As shown in the figures, the set of first superlattice stacked layers 13_1 only show 4 pairs of the first layer groups and the set of second superlattice stacked layers 13_2 also show 4 pairs of the second layer groups. However, the present disclosure is not limited to this pair numbers. In other embodiment, the pair numbers of the set of first superlattice stacked layers 13_1 and the set of second superlattice stacked layers 13_2 may up to 100 pairs. The pair numbers are adjusted according to the power demand or the device thickness of the semiconductor device 100. For example, the device thickness of the semiconductor device 100 may be less than 150 μm. In the thickness range, the pair numbers of each layer groups may be 10~100.

In this plurality of first layer groups and second layer groups, the set of first superlattice stacked layers 13_1 may include an ith AlGaN superlattice layer 132 composed of $Al_{(xi)}Ga_{(1-xi)}N$ and the set of second superlattice stacked layers layers may include an kth InGaN superlattice layer 134 composed of $In_{(zk)}Ga_{(1-zk)}N$, xi and zk are designed ratio values range from 0.3 to 1. In the manufacturing process of forming the set of first superlattice stacked layers 13_1, the composition of the AlGaN superlattice layer 132 at different layer groups may have different Al mole fractions. For example, the value of xi may be controlled at about 0.8, like 0.81, 0.82, 0.84, and so on. In the manufacturing process of forming the set of second superlattice stacked layers 13_2, the composition of the InGaN superlattice layer 134 at different layer groups may have different In mole fractions. For example, the value of zk may be controlled at about 0.7, like 0.71, 0.72, 0.74, and so on.

The different compositions and the different materials formed in the superlattice stack 13 may generate different current flows. In order to form a controllable field effect transistor, the semiconductor device 100 disposes the first transistor area 15 and the second transistor area 16. The first transistor area 15 is electrically connected to the superlattice stack 13. The first transistor area 15 includes a first source contact 15S, a first drain contact 15D and a first gate contact 15G disposed between the first source contact 15S and the first drain contact 15D. In the present disclosure, the first gate contact 15G is adjacent to the first source contact 15S. However, the gate position is not limited in this. In other embodiment, the first gate contact 15G may disposed at middle position or adjacent to the first drain contact 15D. The first gate contact 15G may be disposed in a ring shape. That is, the contact structure is formed on sidewall of the contact via and the insulating material 151 (for example the poly-silicon) is filled in the contact via. The first transistor area 15 has a first depth contacted to the set of first superlattice stacked layers 13_1. The first depth is the depth of the first source contact 15S, the first drain contact 15D and the first gate contact 15G. The first depth is enough to let the first transistor area 15 passes through the set of second superlattice stacked layers 13_2 and reaches to the set of first superlattice stacked layers 13_1, the electric field generated by the first source contact 15S, the first drain contact 15D and the first gate contact 15G is able to control both the first current channels group and the second current channels group.

The second transistor area 16 is electrically connected to the superlattice stack 13. The second transistor area 16 includes a second source contact 16S, a second drain contact 16D and a second gate contact 16G disposed between the second source contact 16S and the second drain contact 16D. In the present disclosure, the second gate contact 16G is adjacent to the second source contact 16S. However, the gate position is not limited in this. In other embodiment, the second gate contact 16G may disposed at middle position or adjacent to the second drain contact 16D. The second gate contact 16G may be disposed in a ring shape. That is, the contact structure is formed on sidewall of the contact via and the insulating material 161 (for example the poly-silicon) is filled in the contact via. The second transistor area 16 has a second depth contacted to the set of second superlattice stacked layers 13_2. The second depth is smaller than the first depth. Thus, the second transistor area 16 only reaches to the set of second superlattice stacked layers 13_2. The electric field generated by the second source contact 16S, the second drain contact 16D and the second gate contact 16G only control the second current channels group.

The first transistor area 15 controls the first current channels group and the second current channels group, and the second transistor area 16 controls the second current channels group. The electric fields at the first transistor area 15 and the second transistor area 16 can be controlled by independently control the first gate contact 15G and the second gate contact 16G. Thus, the semiconductor device 100 can be operated by only at the first transistor area 15, only at the second transistor area 16, or at both the first transistor area 15 and the second transistor area 16. Based on the above operation means, the semiconductor device 100 can be used as a heterostructure field effect transistor with different control modes. The present embodiment provides the semiconductor device 100 with two transistor areas, but the present disclosure is not limited on the numbers recited in the present embodiment. In other embodiment, the numbers of the transistor area can be more than two and the corresponding depths of the transistor areas can be different.

Figure 2A:
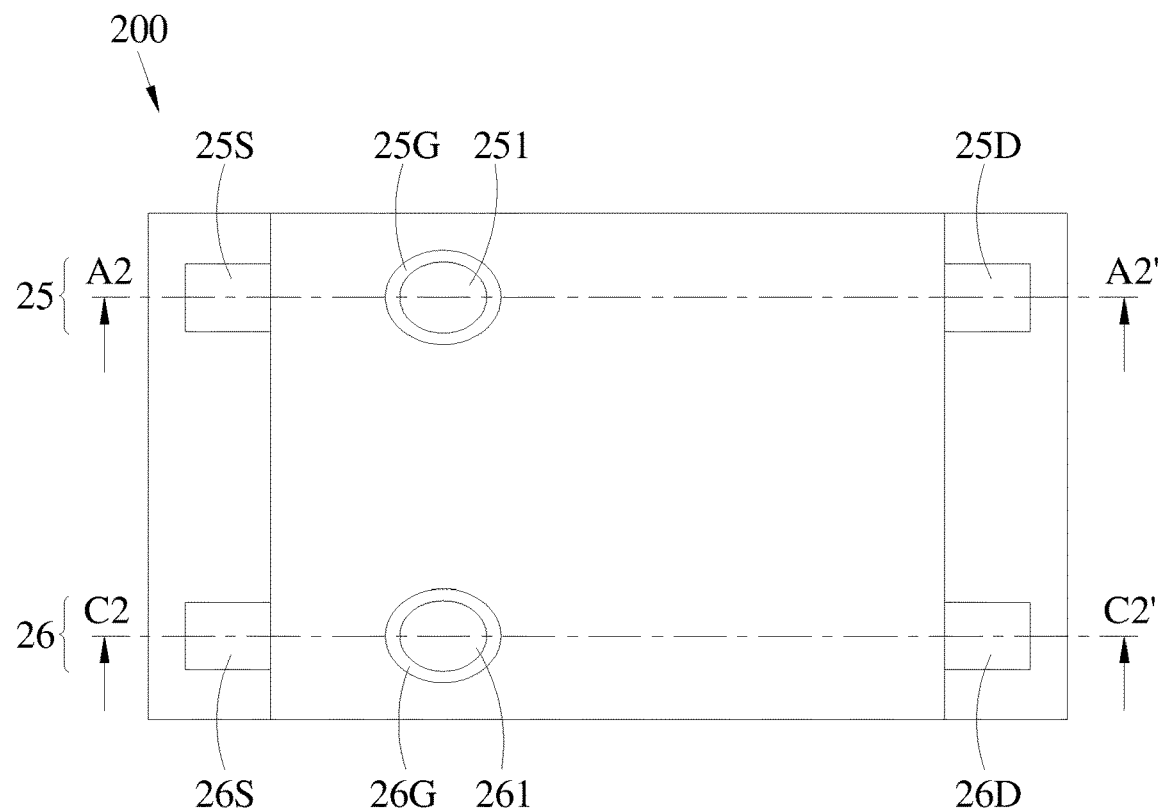
FIG. 2A, FIG. 2B and FIG. 2C are schematic diagrams of the semiconductor device in accordance with the second embodiment of the present disclosure.
Figure 2B:
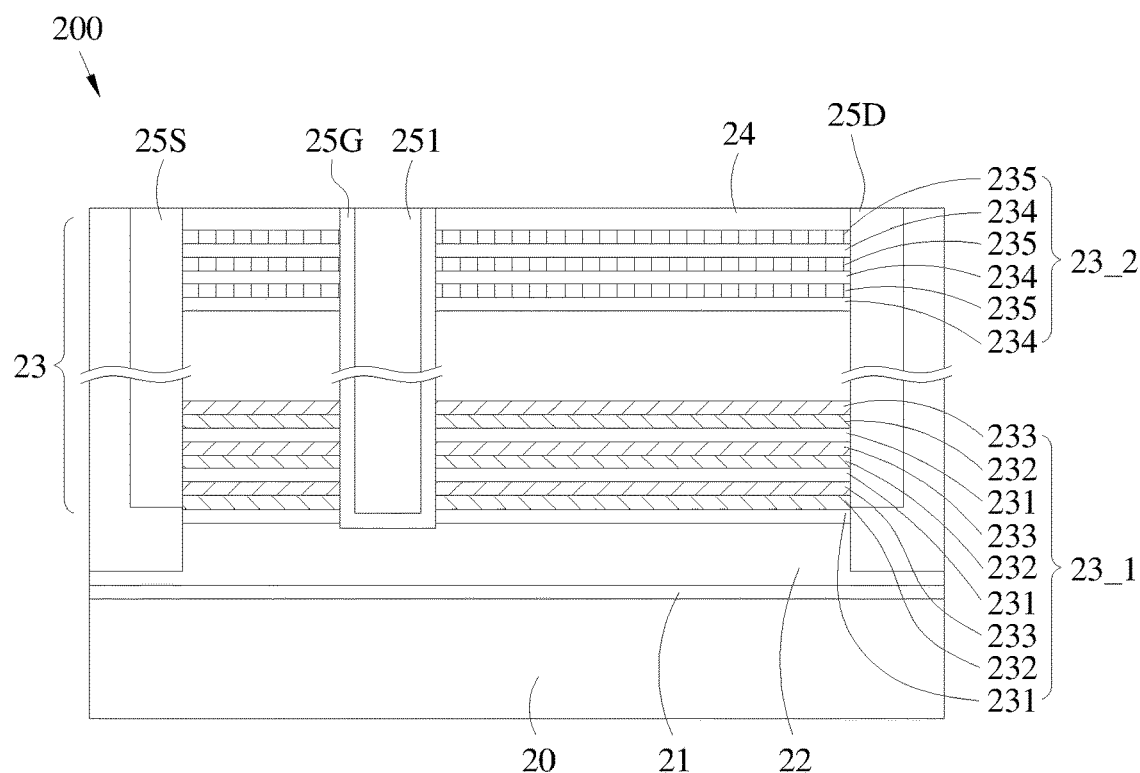
Figure 2C:
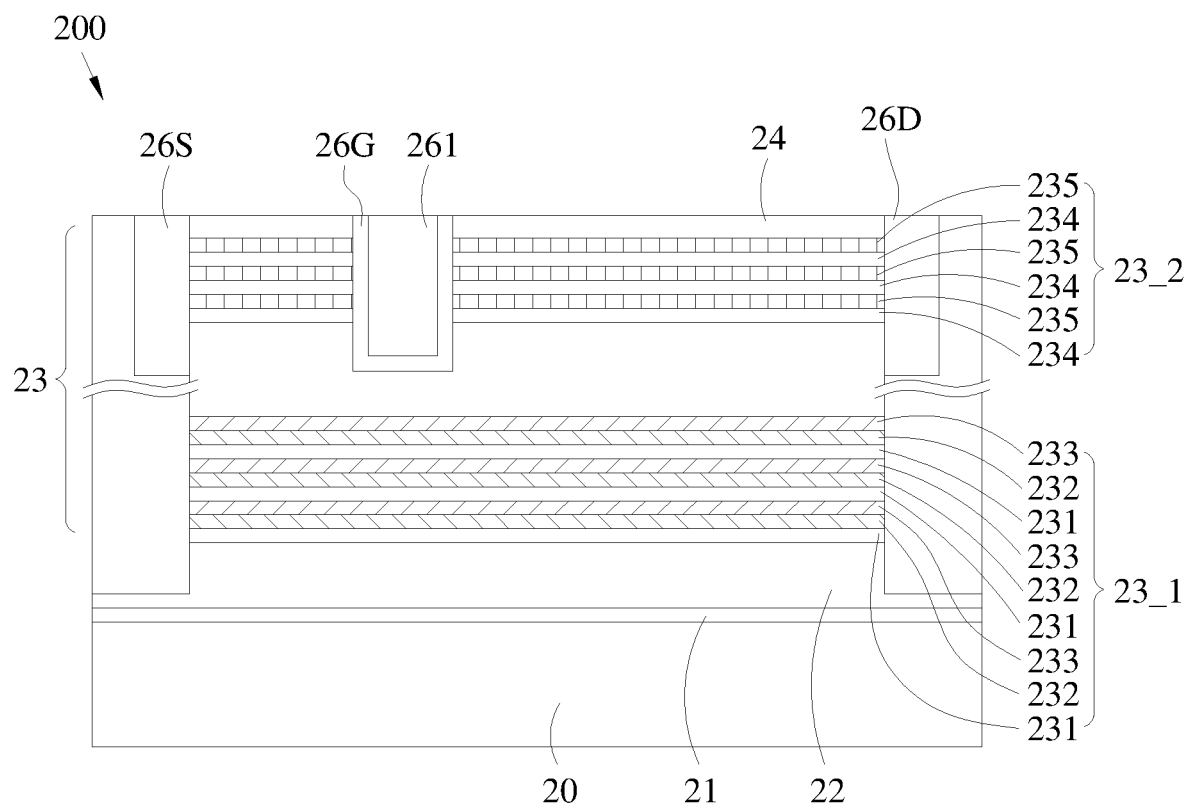

Please refer to FIG. 2A, FIG. 2B and FIG. 2C, which are schematic diagrams of the semiconductor device in accordance with the second embodiment of the present disclosure. FIG. 2A shows the plan view of a semiconductor device 200. FIG. 2B shows the section view of a semiconductor device 200 along the dash line A2A2' of the FIG. 2A. FIG. 2C shows the section view of a semiconductor device 200 along the dash line C2C2' of the FIG. 2A.

As shown in FIG. 2A, FIG. 2B and FIG. 2C, the semiconductor device 200 includes a substrate 20, a nucleation layer 21, a buffer layer 22, a superlattice stack 23, a cap layer 24, a first transistor area 25 and a second transistor area 26. The substrate 20 is a native Silicon carbide (SiC) substrate. The nucleation layer 21 including GaN material is disposed on the substrate 20. The buffer layer 22 including GaN material is disposed on the nucleation layer 21. After forming the buffer layer 22, the superlattice stack 23 is formed on the buffer layer 22. The cap layer 24 including GaN material is disposed on the superlattice stack 23.

The superlattice stack 23 is formed by a plurality of heterojunction superlattice layers. In the present disclosure, the superlattice stack 23 sequentially includes a set of first superlattice stacked layers 23_1 and a set of second superlattice stacked layers 23_2. The set of first superlattice stacked layers 23_1 are disposed on the buffer layer 22 and the set of second superlattice stacked layers 23_2 are disposed on the set of first superlattice stacked layers 23_1. The set of first superlattice stacked layers 23_1 form a two dimensional electron gas (2DEG) carrier transport to generate a first current channels group and the set of second superlattice stacked layers 23_2 form a two dimensional hole gas (2DHG) carrier transport at different depths to generate a second current channels group. The different carrier flow transport means form the multi-channel semiconductor layers.

The set of first superlattice stacked layers 23_1 include a plurality of first layer groups, and each of the plurality of first layer groups sequentially includes GaN superlattice layer 231, AlN spacer layer 232 and AlGaN superlattice layer 233. The AlGaN superlattice layer 233 is used as the barrier layer and GaN superlattice layer 231 is used as the channel layer. One AlGaN superlattice layer 233 and one GaN superlattice layer 231 in the set of first superlattice stacked layers 23_1 may have a thickness about 20 nm to 80 nm. In other embodiment, the thickness of one pair of the AlGaN superlattice layer 233 and one GaN superlattice layer 231 may be about 20 nm to 40 nm. The thickness of the AlN spacer layer 232 may be from 0.5 nm to 1 nm. The heterojunction superlattice layers of the AlGaN superlattice layer 233 and GaN superlattice layer 231 form the two dimensional electron gas carrier transport to generate the first current channels group. The first current channels group is generated in the GaN superlattice layer 231 and is disposed at bottom position adjacent to the buffer layer 22. The AlN spacer layer 232 can increase the carrier mobility, so as to provide a high speed semiconductor device. In addition, the AlN spacer layer 232 is a thin layer for reducing the thickness of the semiconductor device 200.

The set of second superlattice stacked layers 23_2 include a plurality of second layer groups, and each of the plurality of second layer groups sequentially includes GaN superlattice layer 234 and InGaN superlattice layer 235. One InGaN superlattice layer 235 and one GaN superlattice layer 234 in the set of second superlattice stacked layers 23_2 may have a thickness about 20 nm to 80 nm. In other embodiment, the thickness of one pair of the InGaN superlattice layer 235 and one GaN superlattice layer 234 may be about 20 nm to 40 nm. The heterojunction superlattice layers of InGaN superlattice layer 235 and GaN superlattice layer 234 form the two dimensional hole gas carrier transport to generate the second current channels group. The second current channels group is generated in the GaN superlattice layer 234 and is disposed at top position adjacent to the cap layer 24.

As shown in the figures, the set of first superlattice stacked layers 23_1 only show 3 pairs of the first layer groups and the set of second superlattice stacked layers 23_2 also show 3 pairs of the second layer groups. However, in present disclosure is not limited to this pair numbers. In other embodiment, the pair numbers of the set of first superlattice stacked layers 23_1 and the set of second superlattice stacked layers 23_2 may up to 100 pairs. The pair numbers are adjusted according to the power demand or the device thickness of the semiconductor device 200. For example, the device thickness of the semiconductor device 200 may be less than 150 µm. In the thickness range, the pair numbers of each layer groups may be 10~100.

In this plurality of first layer groups and second layer groups, the set of first superlattice stacked layers 23_1 may include an ith AlGaN superlattice layer 233 composed of $Al_{(xi)}Ga_{(1-xi)}N$ and the set of second superlattice stacked layers may include an kth InGaN superlattice layer 235 composed of $In_{(zk)}Ga_{(1-zk)}N$, xi and zk are designed ratio values range from 0.3 to 1. In the manufacturing process of forming the set of first superlattice stacked layers 23_1, the composition of the AlGaN superlattice layer 233 at different layer groups may have different Al mole fractions. For example, the value of xi may be controlled at about 0.6, like 0.61, 0.62, 0.64, and so on. In the manufacturing process of forming the set of second superlattice stacked layers 23_2, the composition of the InGaN superlattice layer 235 at different layer groups may have different In mole fractions. For example, the value of zk may be controlled at about 0.5, like 0.51, 0.52, 0.54, and so on.

The different compositions and the different materials formed in the superlattice stack 23 may generate different current flows. In order to form a controllable field effect transistor, the semiconductor device 200 disposes the first transistor area 25 and the second transistor area 26. The first transistor area 25 is electrically connected to the superlattice stack 23. The first transistor area 25 includes a first source contact 25S, a first drain contact 25D and a first gate contact 25G disposed between the first source contact 25S and the first drain contact 25D. In the present disclosure, the first gate contact 25G is adjacent to the first source contact 25S. However, the gate position is not limited in this. In other embodiment, the first gate contact 25G may disposed at middle position or adjacent to the first drain contact 25D. The first gate contact 25G may be disposed in a ring shape. That is, the contact structure is formed on sidewall of the contact via and the insulating material 251 (for example the poly-silicon) is filled in the contact via. The first transistor area 25 has a first depth contacted to the set of first superlattice stacked layers 23_1. The first depth is the depth of the first source contact 25S, the first drain contact 25D and the first gate contact 25G. The first depth is enough to let the first transistor area 25 passes through the set of second superlattice stacked layers 23_2 and reaches to the set of first superlattice stacked layers 23_1, the electric field generated by the first source contact 25S, the first drain contact 25D and the first gate contact 25G is able to control both the first current channels group and the second current channels group.

The second transistor area 26 is electrically connected to the superlattice stack 23. The second transistor area 26 includes a second source contact 26S, a second drain contact 26D and a second gate contact 26G disposed between the second source contact 26S and the second drain contact 26D. In the present disclosure, the second gate contact 26G is adjacent to the second source contact 26S. However, the gate position is not limited in this. In other embodiment, the second gate contact 26G may disposed at middle position or adjacent to the second drain contact 26D. The second gate contact 26G may be disposed in a ring shape. That is, the contact structure is formed on sidewall of the contact via and the insulating material 261 (for example the poly-silicon) is filled in the contact via. The second transistor area 26 has a second depth contacted to the set of second superlattice stacked layers 23_2. The second depth is smaller than the first depth. Thus, the second transistor area 26 only reaches to the set of second superlattice stacked layers 23_2. The electric field generated by the second source contact 26S, the second drain contact 26D and the second gate contact 25G only control the second current channels group.

The first transistor area 25 controls the first current channels group and the second current channels group, and the second transistor area 26 controls the second current channels group. The electric fields at the first transistor area 25 and the second transistor area 26 can be controlled by independently control the first gate contact 25G and second gate contact 26G. Thus, the semiconductor device 200 can be operated by only at the first transistor area 25, only at the second transistor area 26, or at both the first transistor area 25 and the second transistor area 26. Based on the above operation means, the semiconductor device 200 can be used as a heterostructure field effect transistor with different control modes. The present embodiment provides the semiconductor device 200 with two transistor areas, but the present disclosure is not limited on the numbers recited in the present embodiment. In other embodiment, the numbers of the transistor area can be more than two and the corresponding depths of the transistor areas can be different.

Figure 3A:
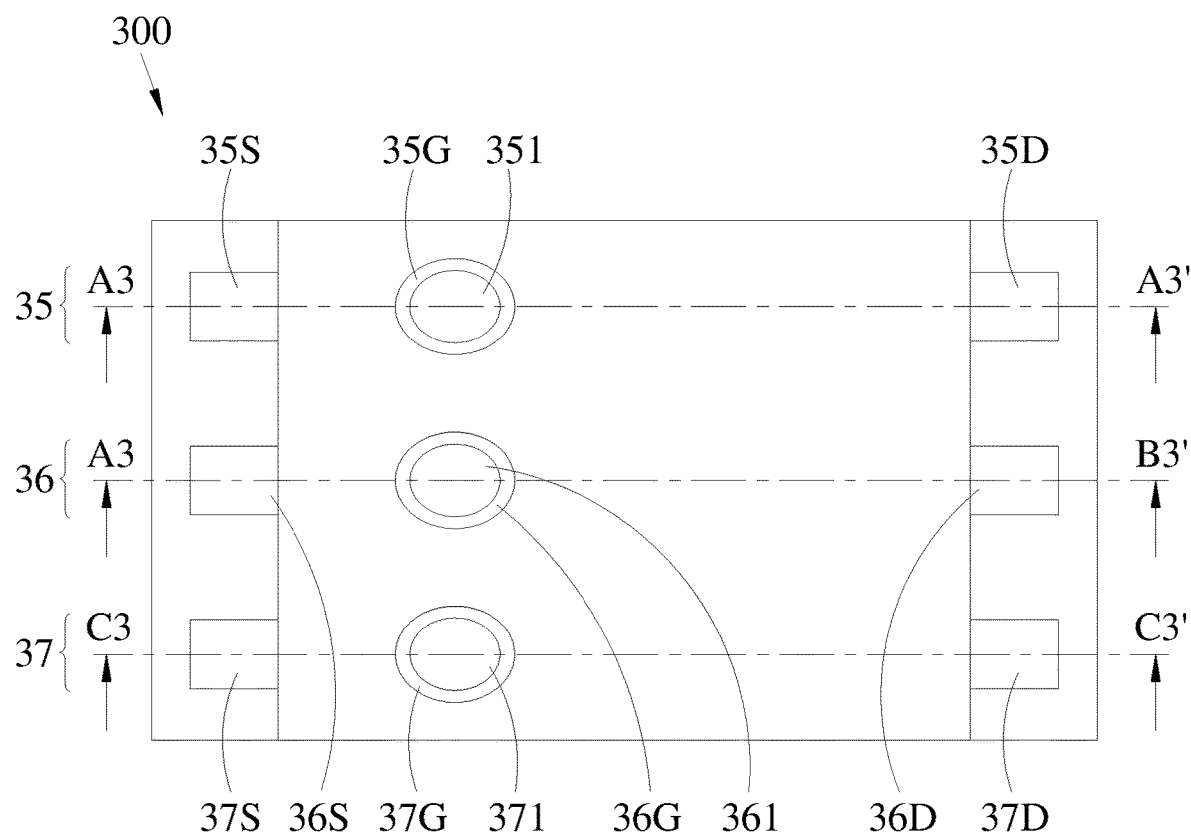
FIG. 3A, FIG. 3B, FIG. 3C and FIG. 3D are schematic diagrams of the semiconductor device in accordance with the third embodiment of the present disclosure.
Figure 3B:
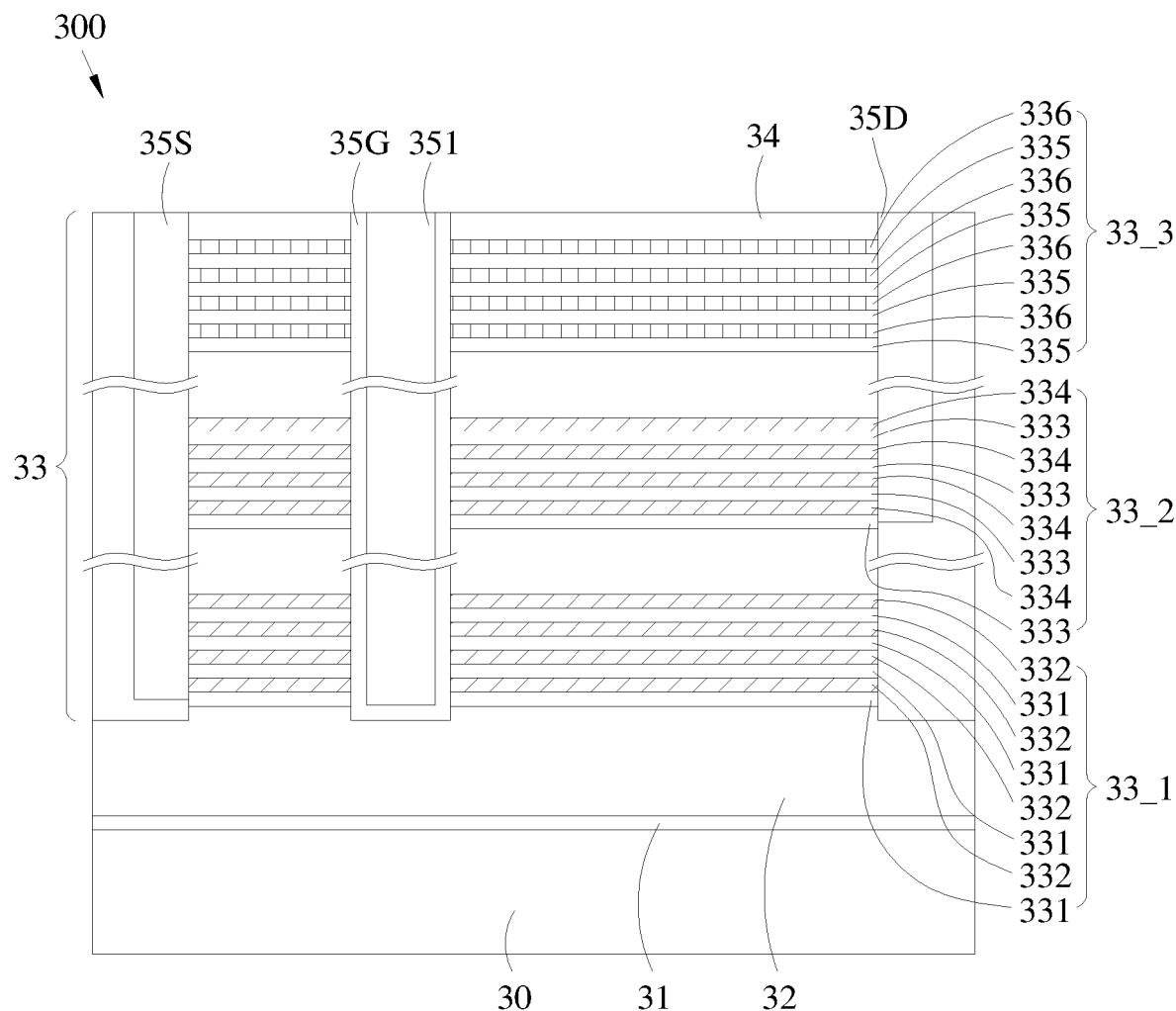
Figure 3C:
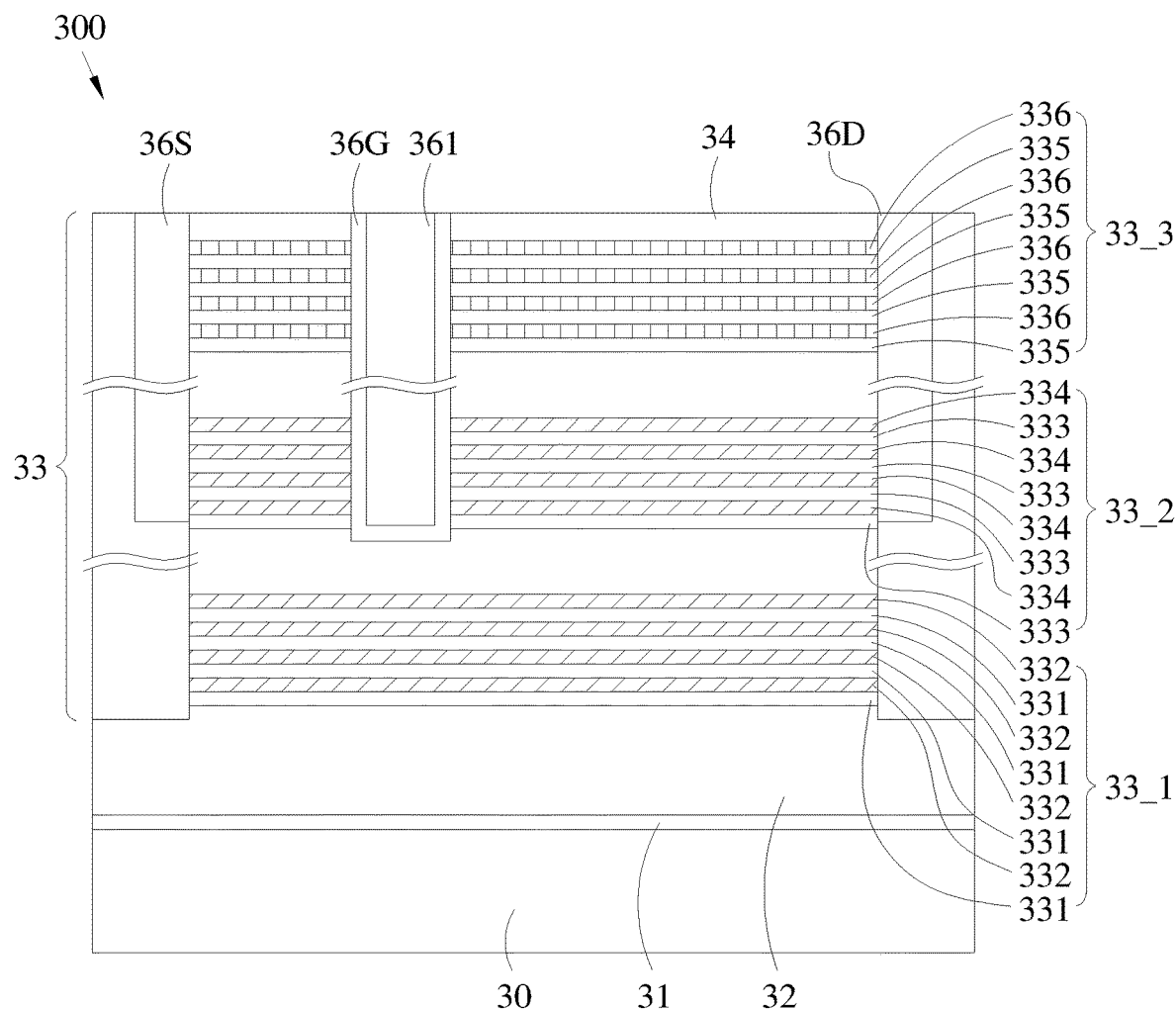
Figure 3D:
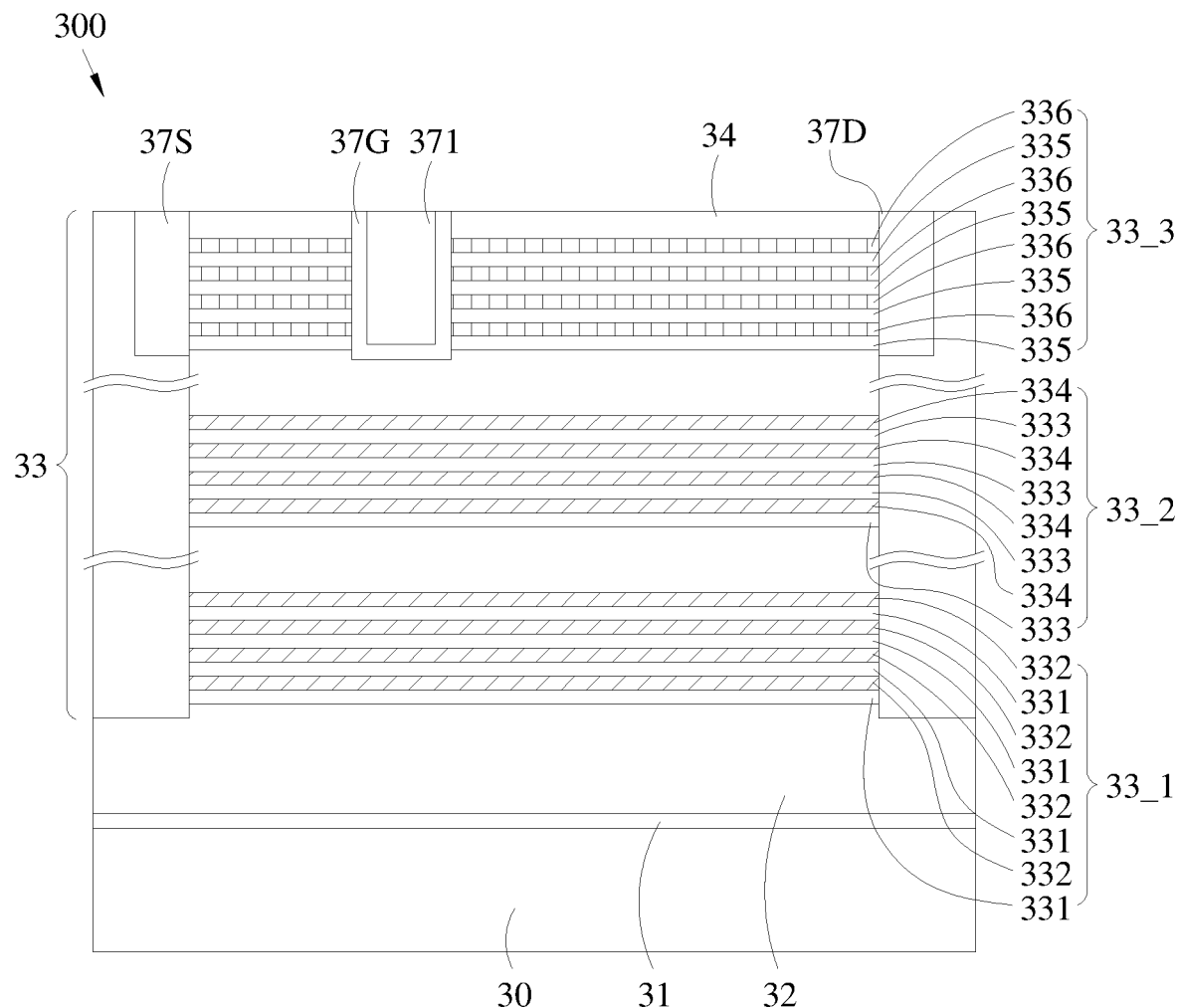

Please refer to FIG. 3A, FIG. 3B, FIG. 3C and FIG. 3D, which are schematic diagrams of the semiconductor device in accordance with the third embodiment of the present disclosure. FIG. 3A shows the plan view of a semiconductor device 300. FIG. 3B shows the section view of a semiconductor device 300 along the dash line A3A3' of the FIG. 3A. FIG. 3C shows the section view of a semiconductor device 300 along the dash line B3B3' of the FIG. 3A. FIG. 3D shows the section view of a semiconductor device 300 along the dash line C3C3' of the FIG. 3A.

As shown in FIG. 3A, FIG. 3B, FIG. 3C and FIG. 3D, the semiconductor device 300 includes a substrate 30, a nucleation layer 31, a buffer layer 32, a superlattice stack 33, a cap layer 34, a first transistor area 35, a second transistor area 36 and a third transistor area 37. The substrate 30 is a native Silicon carbide (SiC) substrate. The nucleation layer 31 including GaN material is disposed on the substrate 30. The buffer layer 32 including GaN material is disposed on the nucleation layer 31. After forming the buffer layer 32, the superlattice stack 33 is formed on the buffer layer 32. The cap layer 34 including GaN material is disposed on the superlattice stack 33.

The superlattice stack 33 is formed by a plurality of heterojunction superlattice layers. In the present disclosure, the superlattice stack 33 sequentially includes a first set of first superlattice stacked layers 33_1, a second set of first superlattice stacked layers 33_2 and a set of second superlattice stacked layers 33_3. The first set of first superlattice stacked layers 33_1 are disposed on the buffer layer 32, the second set of first superlattice stacked layers 33_2 are disposed on the first set of first superlattice stacked layers 33_1, and the set of second superlattice stacked layers 33_3 are disposed on the second set of first superlattice stacked layers 33_2. The first set of first superlattice stacked layers 33_1 and the second set of first superlattice stacked layers 33_2 form a two dimensional electron gas (2DEG) carrier transport to generate a first current channels group and the set of second superlattice stacked layers 33_3 form a two dimensional hole gas (2DHG) carrier transport at different depths to generate a second current channels group. The different carrier flow transport means form the multi-channel semiconductor layers.

The first set of first superlattice stacked layers 33_1 include a plurality of first set layer groups and the second set of first superlattice stacked layers 33_2 include a plurality of second set layer groups. The first set layer groups and the second set layer groups are similar to the first layer groups mentioned in the previous embodiment. Each of the plurality of first set layer groups sequentially includes GaN superlattice layer 331 and AlGaN superlattice layer 332. The AlGaN superlattice layer 332 is used as the barrier layer and GaN superlattice layer 331 is used as the channel layer. Each of the second set layer groups sequentially includes GaN superlattice layer 333 and AlGaN superlattice layer 334. The AlGaN superlattice layer 334 is used as the barrier layer and GaN superlattice layer 333 is used as the channel layer. The thickness of one AlGaN superlattice layer 332 and one GaN superlattice layer 331 in the first set of first superlattice stacked layers 33_1 may be from 20 nm to 80 nm. The thickness of one AlGaN superlattice layer 334 and one GaN superlattice layer 333 in the second set of first superlattice stacked layers 33_2 may be from 20 nm to 80 nm. In other embodiment, the thickness of one pair of the AlGaN layer and the GaN layer in the first set of first superlattice stacked layers 33_1 or in the second set of first superlattice stacked layers 33_2 may be about 20 nm to 40 nm. The heterojunction superlattice layers of the AlGaN superlattice layer 332 (or 334) and GaN superlattice layer 331 (or 333) form the two dimensional electron gas carrier transport to generate the first current channels group.

The set of second superlattice stacked layers 33_3 include a plurality of second layer groups, and each of the plurality of second layer groups sequentially includes GaN superlattice layer 335 and InGaN superlattice layer 336. One InGaN superlattice layer 336 and one GaN superlattice layer 335 in the set of second superlattice stacked layers 33_3 may have a thickness from 20 nm to 80 nm. In other embodiment, the thickness of one pair of the InGaN superlattice layer 336 and the GaN superlattice layer 335 may be about 20 nm to 40 nm. The heterojunction superlattice layers of InGaN superlattice layer 336 and GaN superlattice layer 335 form the two dimensional hole gas carrier transport to generate the second current channels group. The second current channels group is disposed at top position adjacent to the cap layer 34.

As shown in the figures, the first set of first superlattice stacked layers 33_1 show 4 pairs of the first set layer groups, the second set of first superlattice stacked layers 33_2 show 4 pairs of the second set layer groups, and the set of second superlattice stacked layers 33_2 show 4 pairs of the second layer groups. The present disclosure is not limited to this pair numbers. In other embodiment, the pair numbers may up to 100 pairs. The pair numbers are adjusted according to the power demand or the device thickness of the semiconductor device 300. For example, the device thickness of the semiconductor device 300 may be less than 150 μm. In the thickness range, the pair numbers of each layer groups may be 10~100.

In this plurality of first set of first layer groups, second set of first layer groups and second layer groups, the first set of first superlattice stacked layers 33_1 may include an ith AlGaN superlattice layer 332 composed of $Al_{(xi)}Ga_{(1-xi)}N$, the second set of first superlattice stacked layers 33_2 may include an jth AlGaN superlattice layer 334 composed of $Al_{(yj)}Ga_{(1-yj)}N$ and the set of second superlattice stacked layers 33_3 may include an kth InGaN superlattice layer 336 composed of $In_{(zk)}Ga_{(1-zk)}N$, xi, yj and zk are designed ratio values range from 0.3 to 1. In the manufacturing process of forming the first set of first superlattice stacked layers 33_1 and the second set of first superlattice stacked layers 33_2, the composition of the AlGaN superlattice layer 332 (or 334) at different layer groups may have different Al mole fractions. For example, the value of xi may be controlled at about 0.9, like 0.91, 0.92, and so on. The value of yj may be controlled at about 0.7, like 0.71, 0.72, and so on. In the manufacturing process of forming the set of second superlattice stacked layers 33_3, the composition of the InGaN superlattice layer 336 at different layer groups may have different In mole fractions. For example, the value of zk may be controlled at about 0.5, like 0.51, 0.52, and so on. Although the two set of first layer groups both contain the AlGaN layer, the Al mole fractions may be a bigger different between the first set of first layer groups and the second set of first layer groups.

The different compositions and the different materials formed in the superlattice stack 33 may generate different current flows. In order to form a controllable field effect transistor, the semiconductor device 300 disposes the first transistor area 35, the second transistor area 36 and the third transistor area 37. The first transistor area 35 is electrically connected to the superlattice stack 33. The first transistor area 35 includes a first source contact 35S, a first drain contact 35D and a first gate contact 35G disposed between the first source contact 35S and the first drain contact 35D. In the present disclosure, the first gate contact 35G is adjacent to the first source contact 35S. However, the gate position is not limited in this. In other embodiment, the first gate contact 35G may disposed at middle position or adjacent to the first drain contact 35D. The first gate contact 35G may be disposed in a ring shape. That is, the contact structure is formed on sidewall of the contact via and the insulating material 351 (for example the poly-silicon) is filled in the contact via. The first transistor area 35 has a first depth contacted to the first set of first superlattice stacked layers 33_1. The first depth is the depth of the first source contact 35S, the first drain contact 35D and the first gate contact 35G. The first depth is enough to let the first transistor area 35 passes through the set of second superlattice stacked layers 33_3 and the second set of first superlattice stacked layers 33_2 and reaches to the first set of first superlattice stacked layers 33_1, the electric field generated by the first source contact 35S, the first drain contact 35D and the first gate contact 35G is able to control both the first current channels group and the second current channels group.

The second transistor area 36 is electrically connected to the superlattice stack 33. The second transistor area 36 includes a second source contact 36S, a second drain contact 36D and a second gate contact 36G disposed between the second source contact 36S and the second drain contact 36D. In the present disclosure, the second gate contact 36G is adjacent to the second source contact 36S. However, the gate position is not limited in this. In other embodiment, the second gate contact 36G may disposed at middle position or adjacent to the second drain contact 36D. The second gate contact 36G may be disposed in a ring shape. That is, the contact structure is formed on sidewall of the contact via and the insulating material 361 (for example the poly-silicon) is filled in the contact via. The second transistor area 36 has a second depth contacted to the second set of first superlattice stacked layers 33_2. The second depth is smaller than the first depth. Thus, the second transistor area 36 passes through the set of second superlattice stacked layers 33_3 and only reaches to the second set of first superlattice stacked layers 33_2. The electric field generated by the second source contact 36S, the second drain contact 36D and the second gate contact 36G control the first current channels group and the second current channels group. Since the depth of the second transistor area 36 do not reach the first set of first superlattice stacked layers 33_1, the powers generated from the first transistor area 35 and the second transistor area 36 are different.

The third transistor area 37 is electrically connected to the superlattice stack 33. The third transistor area 37 includes a third source contact 37S, a third drain contact 37D and a third gate contact 37G disposed between the third source contact 37S and the third drain contact 37D. In the present disclosure, the third gate contact 37G is adjacent to the third source contact 37S. However, the gate position is not limited in this. In other embodiment, the third gate contact 37G may disposed at middle position or adjacent to the third drain contact 37D. The third gate contact 37G may be disposed in a ring shape. That is, the contact structure is formed on sidewall of the contact via and the insulating material 371 (for example the poly-silicon) is filled in the contact via. The third transistor area 37 has a third depth contacted to the set of second superlattice stacked layers 33_3. The third depth is smaller than the first depth and the second depth. Thus, the third transistor area 37 only reaches to the set of second superlattice stacked layers 33_3. The electric field generated by the third source contact 37S, the third drain contact 37D and the third gate contact 37G only control the second current channels group.

The first transistor area 35 and the second transistor area 36 control the first current channels group and the second current channels group, and the third transistor area 37 controls the second current channels group. The electric fields at the first transistor area 35, the second transistor area 36 and the third transistor area 37 can be controlled by independently control the first gate contact 35G, the second gate contact 36G and the third gate contact 37G. Thus, the semiconductor device 300 can be operated by only at the first transistor area 35, only at the second transistor area 36, only at the third transistor area 37, at any two of the transistor areas or at both the three transistor areas. Based on the above operation means, the semiconductor device 300 can be used as a heterostructure field effect transistor with different control modes. The present embodiment provides the semiconductor device 300 with three transistor areas, but the present disclosure is not limited on the numbers recited in the present embodiment. In other embodiment, the numbers of the transistor area can be more than three and the corresponding depths of the transistor areas can be different.

Figure 4A:
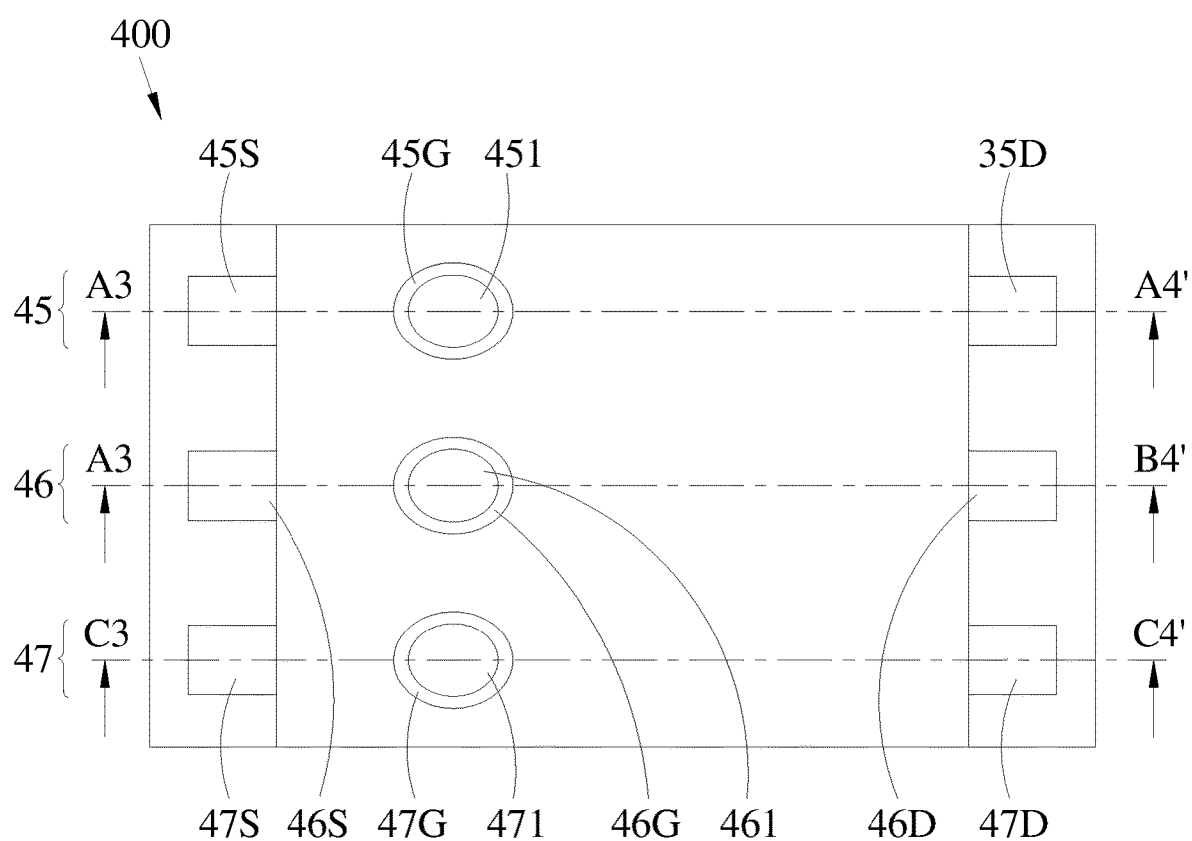
FIG. 4A, FIG. 4B, FIG. 4C and FIG. 4D are schematic diagrams of the semiconductor device in accordance with the fourth embodiment of the present disclosure.
Figure 4B:
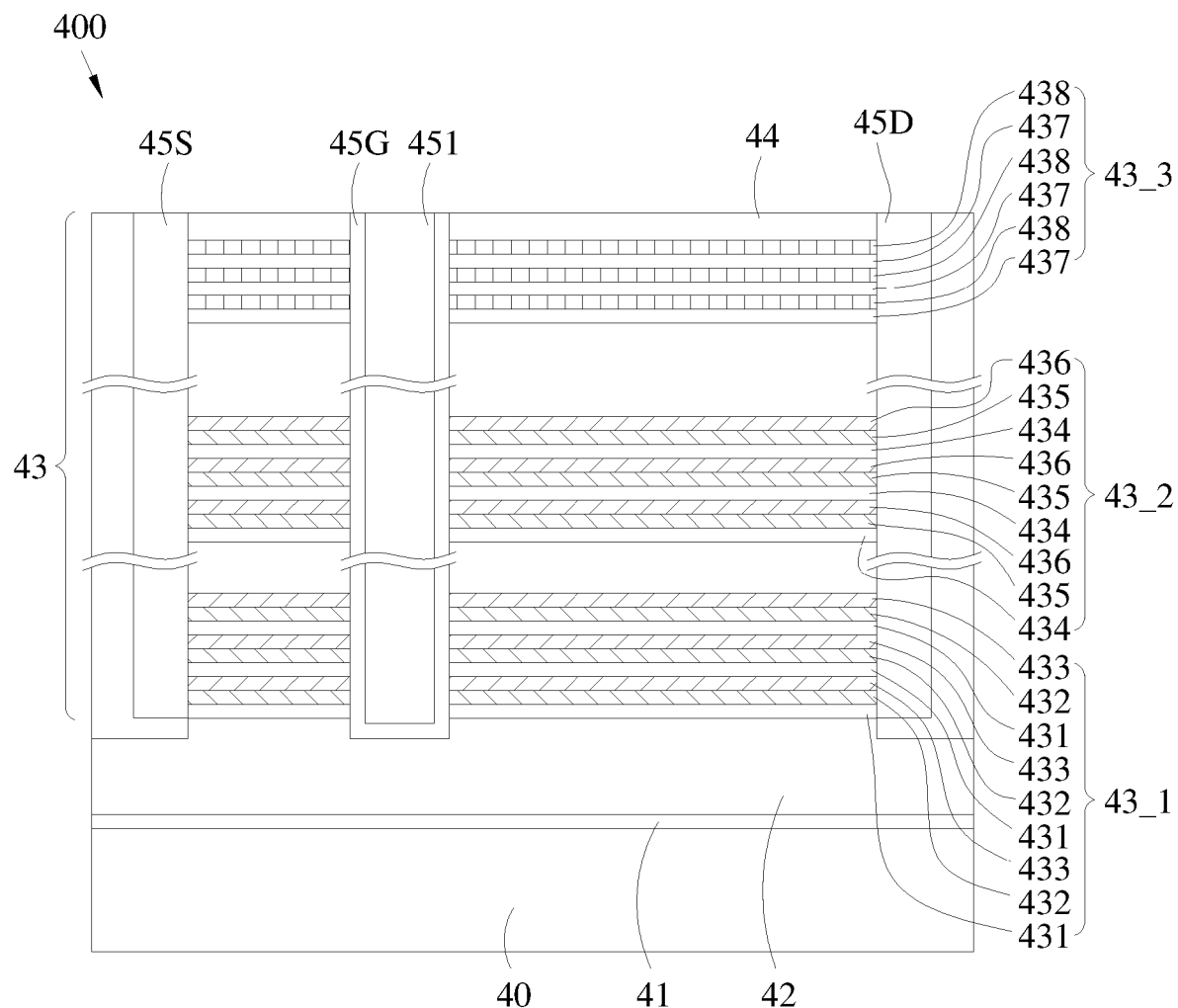
Figure 4C:
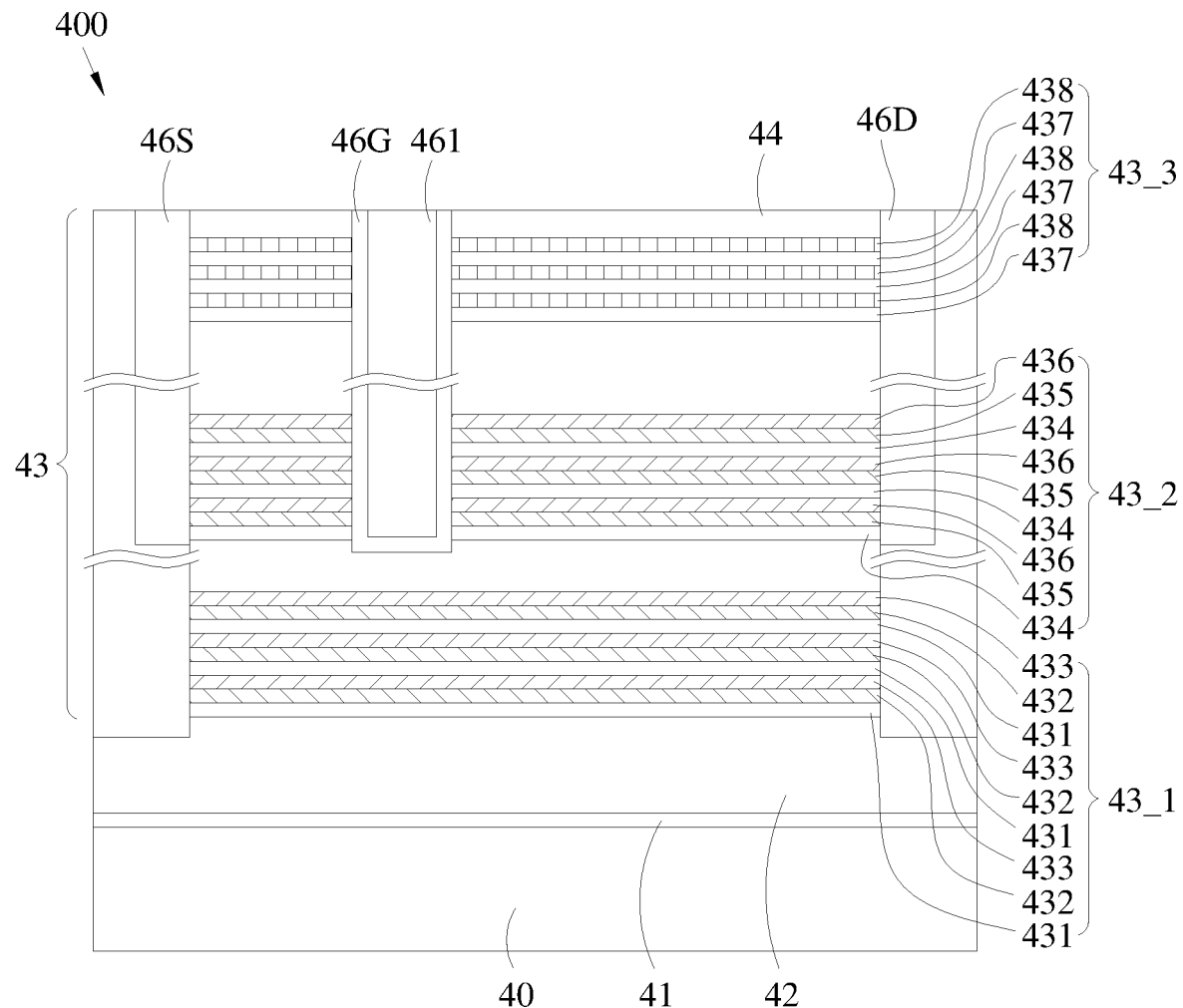
Figure 4D:
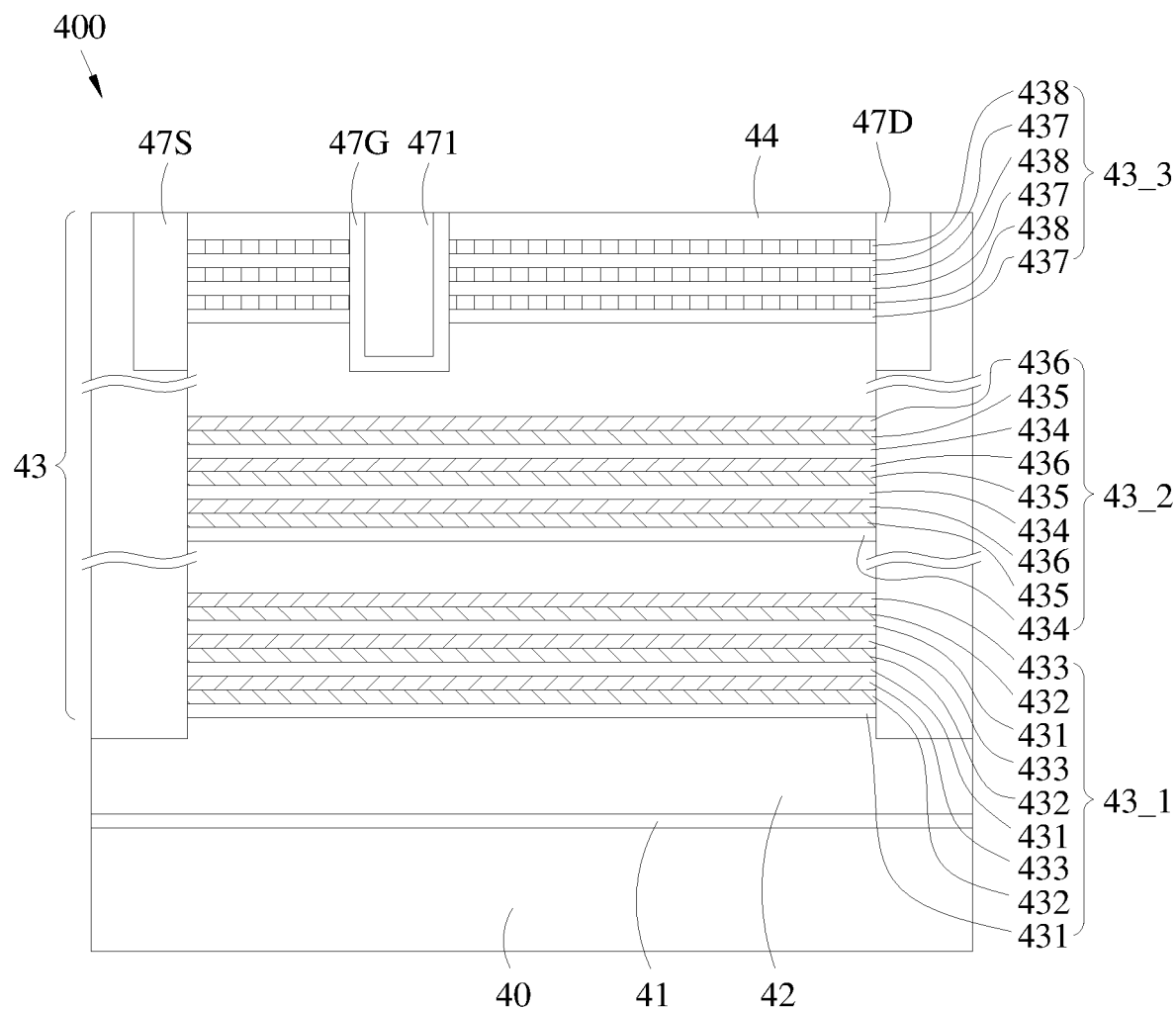

Please refer to FIG. 4A, FIG. 4B, FIG. 4C and FIG. 4D, which are schematic diagrams of the semiconductor device in accordance with the fourth embodiment of the present disclosure. FIG. 4A shows the plan view of a semiconductor device 400. FIG. 4B shows the section view of a semiconductor device 400 along the dash line A4A4' of the FIG. 4A. FIG. 4C shows the section view of a semiconductor device 400 along the dash line B4B4' of the FIG. 4A. FIG. 4D shows the section view of a semiconductor device 400 along the dash line C4C4' of the FIG. 4A.

As shown in FIG. 4A, FIG. 4B, FIG. 4C and FIG. 4D, the semiconductor device 400 includes a substrate 40, a nucleation layer 41, a buffer layer 42, a superlattice stack 43, a cap layer 44, a first transistor area 45, a second transistor area 46 and a third transistor area 47. The substrate 40 is a native Silicon carbide (SiC) substrate. The nucleation layer 41 including GaN material is disposed on the substrate 40. The buffer layer 42 including GaN material is disposed on the nucleation layer 41. After forming the buffer layer 42, the superlattice stack 43 is formed on the buffer layer 42. The cap layer 44 including GaN material is disposed on the superlattice stack 43.

The superlattice stack 43 is formed by a plurality of heterojunction superlattice layers. In the present disclosure, the superlattice stack 43 sequentially includes a first set of first superlattice stacked layers 43_1, a second set of first superlattice stacked layers 43_2 and a set of second superlattice stacked layers 43_3. The first set of first superlattice stacked layers 43_1 are disposed on the buffer layer 42, the second set of first superlattice stacked layers 43_2 are disposed on the first set of first superlattice stacked layers 43_1, and the set of second superlattice stacked layers 43_3 are disposed on the second set of first superlattice stacked layers 43_2. The first set of first superlattice stacked layers 43_1 and the second set of first superlattice stacked layers 43_2 form a two dimensional electron gas (2DEG) carrier transport to generate a first current channels group and the set of second superlattice stacked layers 43_3 form a two dimensional hole gas (2DHG) carrier transport at different depths to generate a second current channels group. The different carrier flow transport means form the multi-channel semiconductor layers.

The first set of first superlattice stacked layers 43_1 include a plurality of first set layer groups and the second set of first superlattice stacked layers 43_2 include a plurality of second set layer groups. Each of the plurality of first set layer groups sequentially includes GaN superlattice layer 431, AlN spacer layer 432 and AlGaN superlattice layer 433. The AlGaN superlattice layer 433 is used as the barrier layer and GaN superlattice layer 431 is used as the channel layer. Each of the second set layer groups sequentially includes GaN superlattice layer 434, AlN spacer layer 435 and AlGaN superlattice layer 436. The AlGaN superlattice layer 436 is used as the barrier layer and GaN superlattice layer 434 is used as the channel layer. The thickness of one AlGaN superlattice layer 433 and one GaN superlattice layer 431 in the first set of first superlattice stacked layers 43_1 may be from 20 nm to 80 nm. The thickness of one AlGaN superlattice layer 436 and one GaN superlattice layer 433 in the second set of first superlattice stacked layers 43_2 may be from 20 nm to 80 nm. In other embodiment, the thickness of one pair of the AlGaN layer and the GaN layer in the first set of first superlattice stacked layers 43_1 or in the second set of first superlattice stacked layers 43_2 may be about 20 nm to 40 nm. The thickness of the AlN spacer layer 432 (or 435) may be from 0.5 nm to 1 nm. The heterojunction superlattice layers of the AlGaN superlattice layer 433 (or 436) and GaN superlattice layer 431 (or 434) form the two dimensional electron gas carrier transport to generate the first current channels group. The first current channels group is disposed at bottom position adjacent to the buffer layer 42. The AlN spacer layer 432 (or 435) can increase the carrier mobility, so as to provide a high speed semiconductor device. In addition, the AlN spacer layer 432 (or 435) is a thin layer for reducing the thickness of the semiconductor device 400.

The set of second superlattice stacked layers 43_3 include a plurality of second layer groups, and each of the plurality of second layer groups sequentially includes GaN superlattice layer 437 and InGaN superlattice layer 438. One InGaN superlattice layer 438 and one GaN superlattice layer 437 in the set of second superlattice stacked layers 43_3 may have a thickness from 20 nm to 80 nm. In other embodiment, the thickness of one pair of the InGaN superlattice layer 438 and the GaN superlattice layer 438 may be about 20 nm to 40 nm. The heterojunction superlattice layers of InGaN superlattice layer 438 and GaN superlattice layer 437 form the two dimensional hole gas carrier transport to generate the second current channels group. The second current channels group is disposed at top position adjacent to the cap layer 34.

As shown in the figures, the first set of first superlattice stacked layers 43_1 show 3 pairs of the first set layer groups, the second set of first superlattice stacked layers 43_2 show 3 pairs of the second set layer groups, and the set of second superlattice stacked layers 43_3 show 3 pairs of the second layer groups. The present disclosure is not limited to this pair numbers. In other embodiment, the pair numbers may up to 100 pairs. The pair numbers are adjusted according to the power demand or the device thickness of the semiconductor device 400. For example, the device thickness of the semiconductor device 400 may be less than 150 µm. In the thickness range, the pair numbers of each layer groups may be 10~100.

In this plurality of first set of first layer groups, second set of first layer groups and second layer groups, the first set of first superlattice stacked layers 43_1 may include an ith AlGaN superlattice layer 433 composed of $Al_{(xi)}Ga_{(1-xi)}N$, the second set of first superlattice stacked layers 43_2 may include an jth AlGaN superlattice layer 436 composed of $Al_{(yj)}Ga_{(1-yj)}N$ and the set of second superlattice stacked layers 43_3 may include an kth InGaN superlattice layer 438 composed of $In_{(zk)}Ga_{(1-zk)}N$, xi, yj and zk are designed ratio values range from 0.3 to 1. In the manufacturing process of forming the first set of first superlattice stacked layers 43_1 and the second set of first superlattice stacked layers 43_2, the composition of the AlGaN superlattice layer 433 (or 436) at different layer groups may have different Al mole fractions. For example, the value of xi may be controlled at about 0.8, like 0.81, 0.82, and so on. The value of yj may be controlled at about 0.6, like 0.61, 0.62, and so on. In the manufacturing process of forming the set of second superlattice stacked layers 43_3, the composition of the InGaN superlattice layer 438 at different layer groups may have different In mole fractions. For example, the value of zk may be controlled at about 0.4, like 0.41, 0.42, and so on. Although the two set of first layer groups both contain the AlGaN layer, the Al mole fractions may be a bigger different between the first set of first layer groups and the second set of first layer groups.

The different compositions and the different materials formed in the superlattice stack 43 may generate different current flows. In order to form a controllable field effect transistor, the semiconductor device 400 disposes the first transistor area 45, the second transistor area 46 and the third transistor area 47. The first transistor area 45 is electrically connected to the superlattice stack 43. The first transistor area 45 includes a first source contact 45S, a first drain contact 45D and a first gate contact 45G disposed between the first source contact 45S and the first drain contact 45D. In the present disclosure, the first gate contact 45G is adjacent to the first source contact 45S. However, the gate position is not limited in this. In other embodiment, the first gate contact 45G may disposed at middle position or adjacent to the first drain contact 45D. The first gate contact 45G may be disposed in a ring shape. That is, the contact structure is formed on sidewall of the contact via and the insulating material 451 (for example the poly-silicon) is filled in the contact via. The first transistor area 45 has a first depth contacted to the first set of first superlattice stacked layers 43_1. The first depth is the depth of the first source contact 45S, the first drain contact 45D and the first gate contact 45G. The first depth is enough to let the first transistor area 45 passes through the set of second superlattice stacked layers 43_3 and the second set of first superlattice stacked layers 43_2 and reaches to the first set of first superlattice stacked layers 43_1, the electric field generated by the first source contact 45S, the first drain contact 45D and the first gate contact 45G is able to control both the first current channels group and the second current channels group.

The second transistor area 46 is electrically connected to the superlattice stack 43. The second transistor area 46 includes a second source contact 46S, a second drain contact 46D and a second gate contact 46G disposed between the second source contact 46S and the second drain contact 46D. In the present disclosure, the second gate contact 46G is adjacent to the second source contact 46S. However, the gate position is not limited in this. In other embodiment, the second gate contact 46G may disposed at middle position or adjacent to the second drain contact 46D. The second gate contact 46G may be disposed in a ring shape. That is, the contact structure is formed on sidewall of the contact via and the insulating material 461 (for example the poly-silicon) is filled in the contact via. The second transistor area 46 has a second depth contacted to the second set of first superlattice stacked layers 43_2. The second depth is smaller than the first depth. Thus, the second transistor area 46 passes through the set of second superlattice stacked layers 43_3 and only reaches to the second set of first superlattice stacked layers 43_2. The electric field generated by the second source contact 46S, the second drain contact 46D and the second gate contact 45G control the first current channels group and the second current channels group. Since the depth of the second transistor area 46 do not reach the first set of first superlattice stacked layers 43_1, the powers generated from the first transistor area 45 and the second transistor area 46 are different.

The third transistor area 47 is electrically connected to the superlattice stack 43. The third transistor area 47 includes a third source contact 47S, a third drain contact 47D and a third gate contact 47G disposed between the third source contact 47S and the third drain contact 47D. In the present disclosure, the third gate contact 47G is adjacent to the third source contact 47S. However, the gate position is not limited in this. In other embodiment, the third gate contact 47G may disposed at middle position or adjacent to the third drain contact 47D. The third gate contact 47G may be disposed in a ring shape. That is, the contact structure is formed on sidewall of the contact via and the insulating material 471 (for example the poly-silicon) is filled in the contact via. The third transistor area 47 has a third depth contacted to the set of second superlattice stacked layers 43_3. The third depth is smaller than the first depth and the second depth. Thus, the third transistor area 46 only reaches to the set of second superlattice stacked layers 43_3. The electric field generated by the third source contact 47S, the third drain contact 47D and the third gate contact 47G only control the second current channels group.

The first transistor area 45 and the second transistor area 46 control the first current channels group and the second current channels group, and the third transistor area 47 controls the second current channels group. The electric fields at the first transistor area 45, the second transistor area 46 and the third transistor area 47 can be controlled by independently control the first gate contact 45G, the second gate contact 46G and the third gate contact 47G. Thus, the semiconductor device 400 can be operated by only at the first transistor area 45, only at the second transistor area 46, only at the third transistor area 47, at any two of the transistor areas or at both the three transistor areas. Based on the above operation means, the semiconductor device 400 can be used as a heterostructure field effect transistor with different control modes. The present embodiment provides the semiconductor device 400 with three transistor areas, but the present disclosure is not limited on the numbers recited in the present embodiment. In other embodiment, the numbers of the transistor area can be more than three and the corresponding depths of the transistor areas can be different.

Figure 5A:
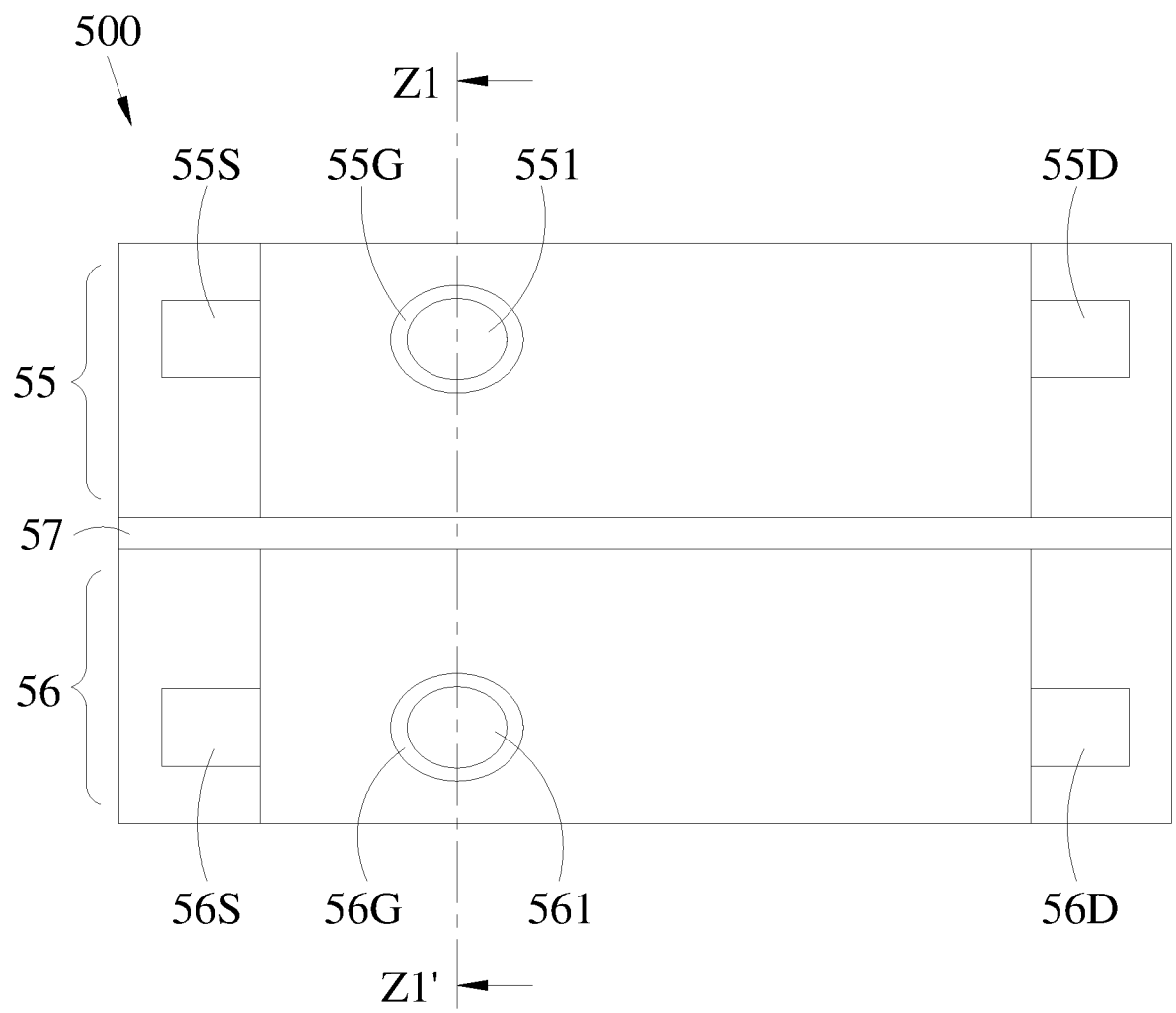
FIG. 5A and FIG. 5B are schematic diagrams of the semiconductor device in accordance with the fifth embodiment of the present disclosure.
Figure 5B:
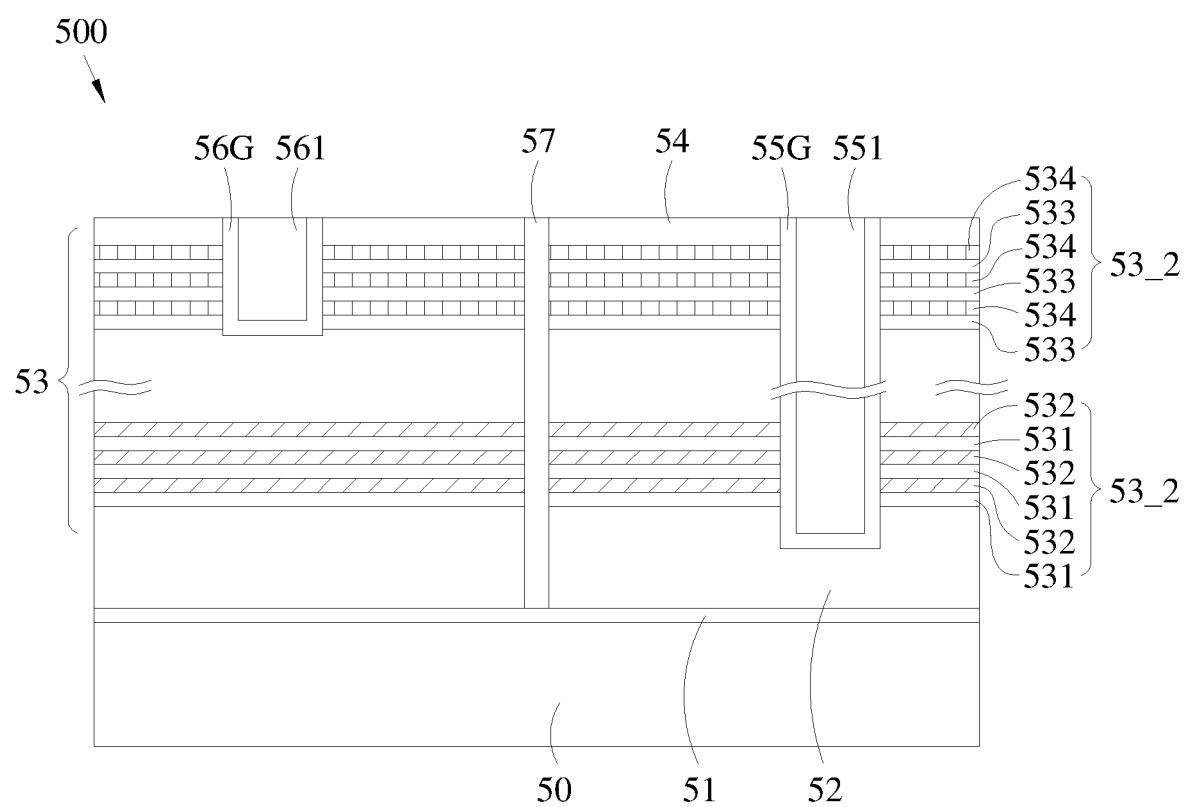

Please refer to FIG. 5A and FIG. 5B, which are schematic diagrams of the semiconductor device in accordance with the fifth embodiment of the present disclosure. FIG. 5A shows the plan view of a semiconductor device 500. FIG. 5B shows the section view of a semiconductor device 500 along the dash line Z1Z1' of the FIG. 5A.

As shown in FIG. 5A and FIG. 5B, the semiconductor device 500 includes a substrate 50, a nucleation layer 51, a buffer layer 52, a superlattice stack 53, a cap layer 54, a first transistor area 55, a second transistor area 56 and an isolate wall 57. The substrate 50 is a native Silicon carbide (SiC) substrate. The nucleation layer 51 including GaN material is disposed on the substrate 50. The buffer layer 52 including GaN material is disposed on the nucleation layer 51. After forming the buffer layer 52, the superlattice stack 53 is formed on the buffer layer 52. The cap layer 54 including GaN material is disposed on the superlattice stack 53.

The superlattice stack 53 is formed by a plurality of heterojunction superlattice layers. In the present disclosure, the superlattice stack 53 sequentially includes a set of first superlattice stacked layers 53_1 and a second set of superlattice stacked layers 53_2. The set of first superlattice stacked layers 53_1 form a two dimensional electron gas (2DEG) carrier transport to generate a first current channels group and the set of second superlattice stacked layers 53_2 form a two dimensional hole gas (2DHG) carrier transport at different depths to generate a second current channels group.

The set of first superlattice stacked layers 53_1 include a plurality of first layer groups, and each of the plurality of first layer groups sequentially includes GaN superlattice layer 531 and AlGaN superlattice layer 532. The AlGaN superlattice layer 532 is used as the barrier layer and GaN superlattice layer 531 is used as the channel layer. One AlGaN superlattice layer 532 and one GaN superlattice layer 531 in the set of first superlattice stacked layers 53_1 may have a thickness from 20 nm to 80 nm. In other embodiment, the thickness of one pair of the AlGaN superlattice layer 532 and the GaN superlattice layer 531 may be from 20 nm to 40 nm. The set of second superlattice stacked layers 53_2 include a plurality of second layer groups, and each of the plurality of second layer groups sequentially includes GaN superlattice layer 533 and InGaN superlattice layer 534. One InGaN superlattice layer 534 and one GaN superlattice layer 533 in the set of second superlattice stacked layers 53_2 may have a thickness from 20 nm to 80 nm. In other embodiment, the thickness of one pair of the InGaN superlattice layer 534 and the GaN superlattice layer 533 may be about 20 nm to 40 nm. The pair numbers are adjusted according to the power demand or the device thickness of the semiconductor device 500.

The set of first superlattice stacked layers 53_1 may include an ith AlGaN superlattice layer 532 composed of $Al_{(xi)}Ga_{(1-xi)}N$ and the set of second superlattice stacked layers 53_2 may include an kth InGaN superlattice layer 534 composed of $In_{(zk)}Ga_{(1-zk)}N$, xi and zk are designed ratio values range from 0.3 to 1. In the manufacturing process of forming the set of first superlattice stacked layers 53_1, the composition of the AlGaN superlattice layer 532 at different layer groups may have different Al mole fractions. For example, the value of xi may be controlled at about 0.8, like 0.81, 0.82, 0.84, and so on. In the manufacturing process of forming the set of second superlattice stacked layers 53_2, the composition of the InGaN superlattice layer 534 at different layer groups may have different In mole fractions. For example, the value of zk may be controlled at about 0.7, like 0.71, 0.72, 0.74, and so on.

The semiconductor device 500 disposes the first transistor area 55 and the second transistor area 56, and the isolate wall 57 is disposed between the first transistor area 55 and the second transistor area 56. The isolate wall 57 may include insulating material (like silicon oxide). The first transistor area 55 is electrically connected to the superlattice stack 53. The first transistor area 55 includes a first source contact 55S, a first drain contact 55D and a first gate contact 55G disposed between the first source contact 55S and the first drain contact 55D. The first gate contact 55G may be disposed in a ring shape. That is, the contact structure is formed on sidewall of the contact via and the insulating material 551 (for example the poly-silicon) is filled in the contact via. The first transistor area 55 has a first depth contacted to the set of first superlattice stacked layers 53_1. The electric field generated by the first source contact 55S, the first drain contact 55D and the first gate contact 55G is able to control both the first current channels group and the second current channels group.

The second transistor area 56 is electrically connected to the superlattice stack 53. The second transistor area 56 includes a second source contact 56S, a second drain contact 56D and a second gate contact 56G disposed between the second source contact 56S and the second drain contact 56D. The second gate contact 56G may be disposed in a ring shape. That is, the contact structure is formed on sidewall of the contact via and the insulating material 561 (for example the poly-silicon) is filled in the contact via. The second transistor area 56 has a second depth contacted to the set of second superlattice stacked layers 53_2. The second depth is smaller than the first depth. Thus, the second transistor area 56 only reaches to the set of second superlattice stacked layers 53_2. The electric field generated by the second source contact 56S, the second drain contact 56D and the second gate contact 55G only control the second current channels group.

The first transistor area 55 controls the first current channels group and the second current channels group, and the second transistor area 56 controls the second current channels group. The electric fields at the first transistor area 55 and the second transistor area 56 can be controlled by independently control the first gate contact 55G and the second gate contact 56G. Thus, the semiconductor device 500 can be operated by only at the first transistor area 55, only at the second transistor area 56, or at both the first transistor area 55 and the second transistor area 56. The semiconductor device 500 can be used as a heterostructure field effect transistor with different control modes. When the first transistor area 55 and the second transistor area 56 are operated independently, the isolate wall 57 disposed between the first transistor area 55 and the second transistor area 56 is able to prevent the interference from the other transistor area.

Figure 6A:
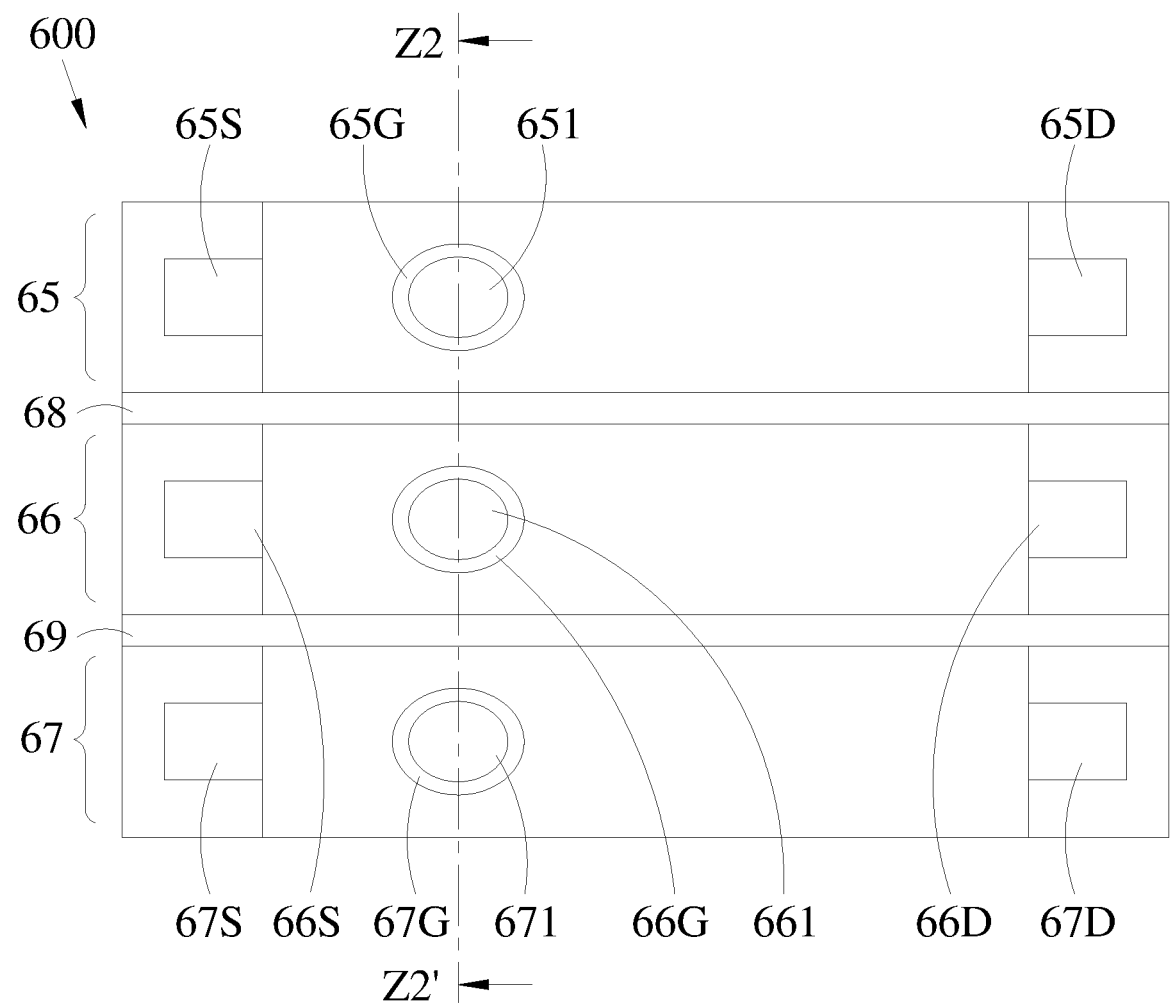
FIG. 6A and FIG. 6B are schematic diagrams of the semiconductor device in accordance with the sixth embodiment of the present disclosure.
Figure 6B:
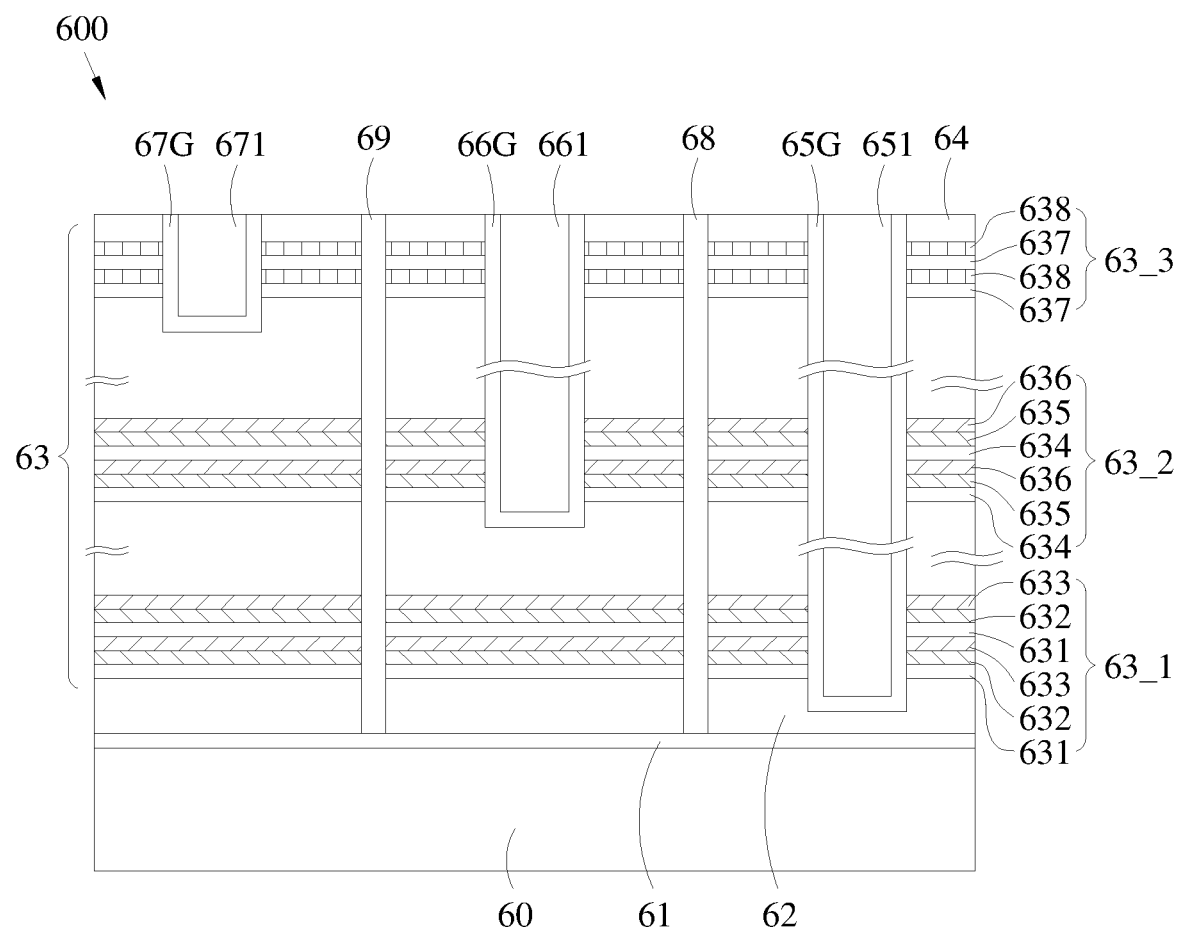

Please refer to FIG. 6A and FIG. 6B, which are schematic diagrams of the semiconductor device in accordance with the sixth embodiment of the present disclosure. FIG. 6A shows the plan view of a semiconductor device 600. FIG. 6B shows the section view of a semiconductor device 600 along the dash line Z2Z2' of the FIG. 6A.

As shown in FIG. 6A and FIG. 6B, the semiconductor device 600 includes a substrate 60, a nucleation layer 61, a buffer layer 62, a superlattice stack 63, a cap layer 64, a first transistor area 65, a second transistor area 66, a third transistor area 67, a first isolate wall 68 and a second isolate wall 69. The substrate 60 is a native Silicon carbide (SiC) substrate. The nucleation layer 61 including GaN material is disposed on the substrate 60. The buffer layer 62 including GaN material is disposed on the nucleation layer 61. After forming the buffer layer 62, the superlattice stack 63 is formed on the buffer layer 62. The cap layer 64 including GaN material is disposed on the superlattice stack 63.

The superlattice stack 63 is formed by a plurality of heterojunction superlattice layers. In the present disclosure, the superlattice stack 63 sequentially includes a first set of first superlattice stacked layers 63_1, a second set of first superlattice stacked layers 63_2 and a set of second superlattice stacked layers 63_3. The first set of first superlattice stacked layers 63_1 are disposed on the buffer layer 62, the second set of first superlattice stacked layers 63_2 are disposed on the first set of first superlattice stacked layers 63_1, and the set of second superlattice stacked layers 63_3 are disposed on the second set of first superlattice stacked layers 63_2. The first set of first superlattice stacked layers 63_1 and the second set of first superlattice stacked layers 63_2 form a two dimensional electron gas (2DEG) carrier transport to generate a first current channels group and the set of second superlattice stacked layers 63_3 form a two dimensional hole gas (2DHG) carrier transport at different depths to generate a second current channels group.

The first set of first superlattice stacked layers 63_1 include a plurality of first set layer groups and the second set of first superlattice stacked layers 63_2 include a plurality of second set layer groups. Each of the plurality of first set layer groups sequentially includes GaN superlattice layer 631, AlN spacer layer 632 and AlGaN superlattice layer 633. The AlGaN superlattice layer 633 is used as the barrier layer and GaN superlattice layer 631 is used as the channel layer. Each of the second set layer groups sequentially includes GaN superlattice layer 634, AlN spacer layer 635 and AlGaN superlattice layer 636. The AlGaN superlattice layer 636 is used as the barrier layer and GaN superlattice layer 634 is used as the channel layer. The thickness of one AlGaN superlattice layer 633 and one GaN superlattice layer 631 in the first set of first superlattice stacked layers 63_1 may be from 20 nm to 80 nm. The thickness of one AlGaN super-lattice layer 636 and one GaN superlattice layer 634 in the second set of first superlattice stacked layers 63_2 may be from 20 nm to 80 nm. In other embodiment, the thickness of one pair of the AlGaN layer and the GaN layer in the first set of first superlattice stacked layers 63_1 or in the second set of first superlattice stacked layers 63_2 may be about 20 nm to 40 nm. The thickness of the AlN spacer layer 632 (or 635) may be from 0.5 nm to 1 nm. The AlN spacer layer 632 (or 635) can increase the carrier mobility, so as to provide a high speed semiconductor device.

The set of second superlattice stacked layers 63_3 include a plurality of second layer groups, and each of the plurality of second layer groups sequentially includes GaN superlattice layer 637 and AlGaN superlattice layer 638. One InGaN superlattice layer 638 and one GaN superlattice layer 637 in the set of second superlattice stacked layers 63_3 may have a thickness from 20 nm to 80 nm. In other embodiment, the thickness of one pair of the InGaN superlattice layer 638 and the GaN superlattice layer 637 may be about 20 nm to 40 nm. The pair numbers are adjusted according to the power demand or the device thickness of the semiconductor device 600.

The first set of first superlattice stacked layers 63_1 may include an ith AlGaN superlattice layer 633 composed of $Al_{(xi)}Ga_{(1-xi)}N$, the second set of first superlattice stacked layers 63_2 may include an jth AlGaN superlattice layer 636 composed of $Al_{(yj)}Ga_{(1-yj)}N$ and the set of second superlattice stacked layers 63_3 may include an kth InGaN superlattice layer 638 composed of $In_{(zk)}Ga_{(1-zk)}N$, xi, yj and zk are designed ratio values range from 0.3 to 1. In the manufacturing process of forming the first set of first superlattice stacked layers 63_1 and the second set of first superlattice stacked layers 63_2, the composition of the AlGaN superlattice layer 633 (or 636) at different layer groups may have different Al mole fractions. For example, the value of xi may be controlled at about 0.8, like 0.81, 0.82, and so on. The value of yj may be controlled at about 0.6, like 0.61, 0.62, and so on. In the manufacturing process of forming the second set of first superlattice stacked layers 63_2, the composition of the InGaN superlattice layer 638 at different layer groups may have different In mole fractions. For example, the value of zk may be controlled at about 0.4, like 0.41, 0.42, and so on.

The semiconductor device 600 disposes the first transistor area 65, the second transistor area 66 and the third transistor area 67. The first isolate wall 68 is disposed between the first transistor area 65 and the second transistor area 66. The second isolate wall 69 is disposed between the second transistor area 66 and the third transistor area 67. The isolate walls may include insulating material (like silicon oxide). The first transistor area 65 is electrically connected to the superlattice stack 63. The first transistor area 65 includes a first source contact 65S, a first drain contact 65D and a first gate contact 65G disposed between the first source contact 65S and the first drain contact 65D. The first gate contact 465G may be disposed in a ring shape. That is, the contact structure is formed on sidewall of the contact via and the insulating material 651 (for example the poly-silicon) is filled in the contact via. The first transistor area 65 has a first depth contacted to the first set of first superlattice stacked layers 63_1. The electric field generated by the first source contact 65S, the first drain contact 65D and the first gate contact 65G is able to control both the first current channels group and the second current channels group.

The second transistor area 66 is electrically connected to the superlattice stack 63. The second transistor area 66 includes a second source contact 66S, a second drain contact 66D and a second gate contact 66G disposed between the second source contact 66S and the second drain contact 66D. The second gate contact 66G may be disposed in a ring shape. That is, the contact structure is formed on sidewall of the contact via and the insulating material 661 (for example the poly-silicon) is filled in the contact via. The second transistor area 66 has a second depth contacted to the second set of first superlattice stacked layers 63_2. The electric field generated by the second source contact 66S, the second drain contact 66D and the second gate contact 65G control the first current channels group and the second current channels group.

The third transistor area 67 is electrically connected to the superlattice stack 63. The third transistor area 67 includes a third source contact 67S, a third drain contact 67D and a third gate contact 67G disposed between the third source contact 67S and the third drain contact 67D. The third gate contact 67G may be disposed in a ring shape. That is, the contact structure is formed on sidewall of the contact via and the insulating material 671 (for example the poly-silicon) is filled in the contact via. The third transistor area 67 has a third depth contacted to the set of second superlattice stacked layers 63_3. The electric field generated by the third source contact 67S, the third drain contact 67D and the third gate contact 67G only control the second current channels group.

The first transistor area 65 and the second transistor area 66 control the first current channels group and the second current channels group, and the third transistor area 67 controls the second current channels group. The electric fields at the first transistor area 65, the second transistor area 66 and the third transistor area 67 can be controlled by independently control the first gate contact 65G, the second gate contact 66G and the third gate contact 67G. Thus, the semiconductor device 600 can be operated by only at the first transistor area 65, only at the second transistor area 66, only at the third transistor area 67, at any two of the transistor areas or at both the three transistor areas. The semiconductor device 600 can be used as a heterostructure field effect transistor with different control modes. When the first transistor area 65, the second transistor area 66 and the third transistor are 67 are operated independently, the first isolate wall 68 disposed between the first transistor area 65 and the second transistor area 66 and the second isolate wall 69 disposed between the second transistor area 66 and the third transistor area 67 are able to prevent the interference from the other transistor area.

The present disclosure disclosed herein has been described by means of specific embodiments. However, numerous modifications, variations and enhancements can be made thereto without departing from the spirit and scope of the disclosure set forth in the claims.

What is claimed is:

1. A semiconductor device comprising:
a substrate;
a nucleation layer disposed on the substrate;
a buffer layer disposed on the nucleation layer;
a superlattice stack disposed on the buffer layer, the superlattice stack sequentially comprising a first set of first superlattice stacked layers, a second set of first superlattice stacked layers and a set of second superlattice stacked layers, the first set of first superlattice stacked layers and the second set of first superlattice stacked layers forming a two dimensional electron gas carrier transport to generate a first current channels group and the set of second superlattice stacked layers forming a two dimensional hole gas carrier transport at different depths to generate a second current channels group;
a cap layer disposed on the superlattice stack;
a first transistor area electrically connected to the superlattice stack, the first transistor area comprising a first source contact, a first drain contact and a first gate contact disposed between the first source contact and the first drain contact, the first transistor area having a first depth contacted to the first set of first superlattice stacked layers;
a second transistor area electrically connected to the superlattice stack, the second transistor area comprising a second source contact, a second drain contact and a second gate contact disposed between the second source contact and the second drain contact, the second transistor area having a second depth contacted to the second set of first superlattice stacked layers; and
a third transistor area electrically connected to the superlattice stack, the third transistor area comprising a third source contact, a third drain contact and a third gate contact disposed between the third source contact and the third drain contact, the third transistor area having a third depth contacted to the set of second superlattice stacked layers;
wherein the first transistor area and the second transistor area control the first current channels group and the second current channels group, and the third transistor area controls the second current channels group, and
wherein the first set of first superlattice stacked layers comprise a plurality of first set layer groups, each of the plurality of first set layer groups sequentially comprises a GaN superlattice layer, an AlN spacer layer and an AlGaN superlattice layer, the second set of first superlattice stacked layers comprise a plurality of second set layer groups, each of the plurality of second set layer groups sequentially comprises a GaN superlattice layer, an AlN spacer layer and an AlGaN superlattice layer, and the set of second superlattice stacked layers comprise a plurality of second layer groups, each of the plurality of second layer groups sequentially comprises a GaN superlattice layer and an InGaN superlattice layer.

2. The semiconductor device of claim 1, wherein thickness of one AlGaN superlattice layer and one GaN superlattice layer in the first set of first superlattice stacked layers is from 20 nm to 80 nm, thickness of one AlGaN superlattice layer and one GaN superlattice layer in the second set of first superlattice stacked layers is from 20 nm to 80 nm, and thickness of one InGaN superlattice layer and one GaN superlattice layer in the set of second superlattice stacked layers is from 20 nm to 80 nm.

3. The semiconductor device of claim 2, wherein the first set of first superlattice stacked layers comprise an ith AlGaN superlattice layer composed of $Al_{(xi)}Ga_{(1-xi)}N$, the second set of first superlattice stacked layers comprise an jth AlGaN superlattice layer composed of $Al_{(yj)}Ga_{(1-yj)}N$ and the set of second superlattice stacked layers comprise an kth InGaN superlattice layer composed of $In_{(zk)}Ga_{(1-zk)}N$, where xi, yj and zk are designed ratio values range from 0.3 to 1.

4. The semiconductor device of claim 1, wherein thickness of one AlGaN superlattice layer and one GaN superlattice layer in the first set of first superlattice stacked layers is from 20 nm to 80 nm, thickness of one AlGaN superlattice layer and one GaN superlattice layer in the second set of first superlattice stacked layers is from 20 nm to 80 nm, thickness of one InGaN superlattice layer and one GaN superlattice layer in the set of second superlattice stacked layers is from 20 nm to 80 nm, and thickness of the AlN spacer layer is from 0.5 nm to 1 nm.

5. The semiconductor device of claim 1, wherein the first set of first superlattice stacked layers comprise an ith AlGaN superlattice layer composed of $Al_{(xi)}Ga_{(1-xi)}N$, the second set of first superlattice stacked layers comprise an jth AlGaN superlattice layer composed of $Al_{(yj)}Ga_{(1-yj)}N$ and the set of second superlattice stacked layers comprise an kth InGaN superlattice layer composed of $In_{(zk)}Ga_{(1-zk)}N$, where xi, yj and zk are designed ratio values range from 0.3 to 1.

6. The semiconductor device of claim 1, further comprises isolate walls disposed between the first transistor area and the second transistor area, and between the second transistor area and the third transistor area.

7. The semiconductor device of claim 1, wherein the semiconductor device has a device thickness, the device thickness is less than 150 μm.

* * * * *